United States Patent [19]
Hashizume et al.

[11] Patent Number: 6,142,614
[45] Date of Patent: Nov. 7, 2000

[54] PIEZOELECTRIC ACTUATOR USING PASSIVATION FILM OR INTERLAYER INSULATING FILM ALONG WITH AN INSULATING FILM TO OBTAIN BETTER ADHESION

[75] Inventors: Tsutomu Hashizume; Akira Matsuzawa, both of Nagano, Japan

[73] Assignee: Seiko Epson Corporation, Tokyo, Japan

[21] Appl. No.: 08/965,419

[22] Filed: Nov. 6, 1997

[30] Foreign Application Priority Data

Nov. 6, 1996 [JP] Japan .................................... 8-293686
Nov. 5, 1997 [JP] Japan .................................... 9-302792

[51] Int. Cl.[7] .................................................... B41J 2/045
[52] U.S. Cl. ............................ 347/70; 310/328; 310/331; 310/365
[58] Field of Search .................................. 347/12, 68–71, 347/64; 310/328, 331, 365, 364, 333, 330

[56] References Cited

U.S. PATENT DOCUMENTS

| 4,349,762 | 9/1982 | Kitamura et al. | 310/331 |
| 4,456,850 | 6/1984 | Inoue et al. | 310/331 |
| 5,495,137 | 2/1996 | Park et al. | 310/331 |
| 5,719,607 | 2/1998 | Hasegawa et al. | 347/70 |
| 5,761,783 | 6/1998 | Osawa et al. | 29/25.35 |

*Primary Examiner*—John Barlow
*Assistant Examiner*—C. Dickens
*Attorney, Agent, or Firm*—Sughrue, Mion, Zinn, Macpeak & Seas, PLLC

[57] ABSTRACT

Lower electrodes are disposed independently of each other for respective ink cavities through a silicon oxide film on a silicon substrate. PZT films and upper electrodes are disposed on the respective lower electrodes, and then an interlayer insulating film or a passivation film is disposed on top of the whole layer.

18 Claims, 15 Drawing Sheets

PIEZOELECTRIC ACTUATOR USING PASSIVATION FILM OR INTERLAYER INSULATING FILM ALONG WITH AN INSULATING FILM TO OBTAIN BETTER ADHESION

BACKGROUND OF THE INVENTION

The present invention relates to an actuator with piezo-electric element and a method for producing the same, and more particularly to an actuator with piezo-electric element in various kinds of equipment, an ink-jet recording head using the actuator, and a method for producing the actuator.

Heretofore, actuators made of lead titanate zirconate (hereinafter called "PZT") have been used as ink-jet driving sources of ink-jet recording heads, that is, as actuators for converting electric energy into mechanical energy. Such an ink-jet recording head is equipped with desired elements including a head base where a number of separate ink passageways (e.g., ink cavities and ink reservoirs) are formed, a diaphragm mounted on the head base in such a way as to cover the whole ink passageway, lower electrodes attached to separate portions corresponding to the respective ink passageways of the diaphragm, electrode elements each having PZT films and upper electrodes, wiring formed:through an interlayer insulating film and so forth The ink-jet recording head thus structured is so designed as to force out ink contained in the individual ink passageway from a nozzle plate provided for the individual ink-jet ink passageway by displacing the PZT film by applying an electric field to the PZT film.

The ink-jet recording head is usually manufactured through the following steps of: forming a thermal oxide film on a single crystal silicon substrate; then forming electrode elements including lower electrodes, PZT films and upper electrodes which are in desired shapes; further forming desired elements such as wiring connected to the electrode elements through an interlayer insulating film; forming a thermal oxide film on a side opposite to the side on which the electrode elements of the single crystal silicon substrate; selectively etching portions corresponding to the region where the electrode elements of the; single crystal silicon substrate are formed; and forming separate ink passageways (e.g., ink cavities and ink reservoirs). When the etching is conducted, a passivation film for protecting the elements is formed. Subsequently, the ink-jet, recording head is completed through the desired steps of, for example, installing a nozzle plate with ink discharge ports formed therein and so on.

In the conventional ink-jet recording heads, platinum or platinum alloy is normally used to form the upper and lower electrodes. However, platinum or platinum alloy is poor in reactivity and disadvantageous in that, for example, it has poor adhesion to the insulating and interlayer insulating films; therefore, these films tend to peel off the elements, thus developing problems of reducing the reliability of the actuator with the piezo-electric element and the like.

In the process of manufacturing the conventional ink-jet recording head, the passivation film is formed in order to protect the elements when the separate ink passageways are formed. Although a fluoroplastic film and a silicon oxide film, for example, are used as such a passivation film, the problem is that adhesion to the substrate where the elements are formed is insufficient. More specifically, the adhesive force between the platinum film and the fluoroplastic film and the adhesive force between the platinum film and the silicon oxide film, for example, are both fragile. Consequently, there develops a problem resulting in making insufficient the adhesion of the passivation film to the substrate when the contact area of the platinum film with the passivation film (the fluoroplastic film and the silicon oxide film). Incidentally, the passivation film is normally removed after the ink passageways are formed.

A high-concentration alkaline solution such as a potassium hydroxide aqueous solution ranging from 5 wt % to 40 wt % is used as an etching solution when etching is conducted to form the aforementioned ink passageways. When the etching solution is brought into contact with the elements at the time of etching, there is a problem arising from causing the elements to peel off the substrate or causing it to be damaged. More specifically, if the single crystal silicon substrate is etched so that the etching solution reaches the diaphragm (e.g., the silicon oxide film), the alkaline aqueous solution or an etching reaction product will transmit to the diaphragm, thus developing the problem of damaging the elements.

SUMMARY OF THE INVENTION

An object of the present invention intended to solve the foregoing problems is to provide a highly reliable actuator with piezo-electric element by improving the adhesion of an interlayer insulating film and a passivation film, and a method for producing such an actuator with a piezo-electric element.

Another object of the present invention is to provide an actuator with a piezo-electric element that can be produced at a lower cost by utilizing a passivation film for protecting the element from etching as a wiring-forming film in order to simplify a manufacturing process, and a method for producing such an actuator with a piezo-electric element.

In order to accomplish the objects above, an actuator with piezo-electric element according to the present invention comprises lower electrodes formed on a substrate through an insulating film, piezo-electric films formed on the respective lower electrodes, upper electrodes formed on the respective piezo-electric films, and an interlayer insulating film for covering the lower electrodes, piezo-electric films and the upper electrodes, wherein the lower electrodes are formed independently of each ether on a segment basis; and the insulating film formed between the segments is kept in direct contact with the interlayer insulating film.

Further, an actuator with piezo-electric element according to the present invention comprises lower electrodes formed on a substrate through an insulating film, piezo-electric films formed on the respective lower electrodes, upper electrodes formed on the respective piezo-electric films, and a passivation film covering the lower electrodes, piezo-electric films and the upper electrodes, wherein the lower electrodes are formed independently of each other on a segment basis; and the insulating film formed between the segments is kept in direct contact with the passivation film.

With this structure, a part of the interlayer insulating film or the passivation film is formed on the insulating film, that is, the interlayer insulating film or the passivation film is made to adhere securely to both sides of the electrode element. It is therefore possible to form a chemically stable interlayer insulating film or a passivation film having great covering power.

An actuator with piezo-electric element according to the present invention further comprises a cavity in a position of the substrate corresponding to the position where the lower electrode is formed, the width of the lower electrode being narrower than the width of the cavity. With this structure, vibration having a great amplitude in addition to the aforementioned advantage is obtainable since the lower electrode is formed in a part of the diaphragm situated in the cavity region.

Further, an actuator with piezo-electric element according to the present invention comprises a cavity in a position of the substrate corresponding to the position where the lower electrode is formed, the width of the lower electrode being the same as or greater than the width of the cavity. With thin structure, the oxygen produced at the time of etching is effectively prevented from penetrating into the piezo-electric film, to say nothing of improvement in the adhesion of the interlayer insulating film or the passivation film.

Further, wiring may be formable between the lower electrode and a lower electrode adjacent thereto.

Further, an actuator with piezo-electric element according to the present invention comprises lower electrodes formed on a substrate through an insulating film, piezo-electric films formed on the respective lower electrodes, upper electrodes formed on the respective piezo-electric films, and an interlayer insulating film for covering the lower electrodes, piezo-electric films and the upper electrodes, wherein the lower electrode has an opening to which the insulating film is exposed in a desired region other than the region where the piezo-electric film and the upper electrode are formed, the insulating film thus exposed being brought into direct contact with the interlayer insulating film.

Further, an actuator with piezo-electric element according to the present invention comprises lower electrodes formed on a substrate through an insulating film, piezo-electric films formed on the respective lower electrodes, upper electrodes formed on the respective piezo-electric films, and a passivation film covering the lower electrodes, piezo-electric films and the upper electrodes, wherein the lower electrode has an opening to which the insulating film is exposed in a desired region other than the region where the piezo-electric film and the upper electrode are formed, the insulating film thus exposed being brought into direct contact with the passivation film.

With this structure, the interlayer insulating film or the passivation film is made to adhere securely to the insulating film through the opening. It is therefore possible to form a chemically stable interlayer insulating film or a passivation film having great covering power.

The lower electrode may be made of platinum or platinum alloy.

Further, an actuator with piezo-electric element according to the present invention comprises first lower electrodes formed through an insulating film on a substrate, second lower electrodes formed on the respective first lower electrodes, piezo-electric films formed on the respective second lower electrodes, upper electrodes formed on the respective piezo-electric films an interlayer insulating film for covering the first and second lower electrodes, the piezo-electric films and the Upper electrodes, wherein the first lower electrode is made of conductive material other than platinum or platinum alloy; the second lower electrodes are formed independently of each other on a segment basis; and the first lower electrode formed between the segments is kept in direct contact with the interlayer insulating film.

Further, an actuator with piezo-electric element according to the present invention comprises first lower electrodes formed through an insulating film on a substrate, second lower electrodes formed on the respective first lower electrodes, piezo-electric films formed on the respective second lower electrodes, upper electrodes formed on the respective piezo-electric films, a passivation film for covering the first and second lower electrodes, the piezo-electric films and the upper electrodes, wherein the first lower electrode is made of conductive material other than platinum or platinum alloy; the second lower electrodes are formed independently of each other on a segment basis; and the first lower electrode formed between the segments is kept in direct contact with the passivation film.

With this structure, a part of the interlayer insulating film or the passivation film is formed on the first lower electrode made of conductive material other than platinum platinum alloy, that is, the interlayer insulating film or the passivation film is lade to adhere securely to both sides of the electrode element. It is therefore possible to form a chemically stable interlayer insulating film or a passivation film having great covering power.

An actuator with piezo-electric element according to the present invention may further comprise a cavity in a position of the substrate corresponding to the position where the second lower electrode is formed, the width of the second lower electrode being narrower than the width of the cavity.

An actuator with piezo-electric element according to the present invention may further comprise a cavity in a position of the substrate corresponding to the position where the second lower electrode is formed, the width of the second lower electrode being the same as or greater than the width of the cavity.

The second lower electrode may be made of platinum or platinum alloy. Further, at least the lowermost layer of the first lower electrode may be formed of a nickel film. Further, at least the lowermost layer of the first lower electrode may be formed of a titanium film. At least the lowermost layer of the first lower electrode may be formed of a titanium oxide film. Further, the first lower electrode employs a four-layered structure comprising a nickel film, a titanium film, a titanium oxide film and a titanium film which are arranged in order from the substrate side.

Further, a method for producing an actuator with piezo-electric element according to the present invention comprises the steps of forming a lower-electrode-forming film, a piezo-electric film and an upper-electrode-forming film in this order on a substrate through an insulating film, letting lower electrodes form electrode elements independently of each other on a segment basis by patterning the lower-electrode-forming film, the piezo-electric film and the upper-electrode-forming film, and forming an interlayer insulating film for covering the electrode elements on the substrate where the insulating film and the electrode elements are formed.

Further, a method for producing an actuator with piezo-electric element according to the present invention comprises the steps of forming a lower-electrode-forming film, a piezo-electric film and an upper-electrode-forming film in this order on a substrate through an insulating film, letting lower electrodes form electrode elements independently of each other on a segment basis by patterning the lower-electrode-forming film, the piezo-electric film and the upper-electrode-forming film, and forming a passivation film for covering the electrode elements on the substrate where the insulating film and the electrode elements are formed.

Further, a method for producing an actuator with piezo-electric element according to the present invention may include the step of selectively forming a cavity in a position of the substrate corresponding to the position where the lower electrode is formed in such a manner that the width of the cavity is narrower than the width of the lower electrodes.

Further, a method for producing an actuator with piezo-electric element according to the present invention may include the step of selectively forming a cavity in a position of the substrate corresponding to the position where the lower electrode is formed in such a manner that the width of the cavity is the same as or greater than the width of the lower electrode.

Further, a method for producing an actuator with a piezo-electric element according to the present invention comprises the steps of forming a first lower-electrode-forming film, a second lower-electrode-forming film, a piezo-electric film and an upper-electrode-forming film in this order on a substrate through an insulating film, letting second lower electrodes form electrode elements independently of each other on a segment basis by patterning the first and second lower-electrode-forming films, the piezo-electric film and the upper-electrode-forming film and forming an interlayer insulating film for covering the electrode elements on the substrate where the insulating film and the electrode elements are formed.

Further, a method for producing an actuator with piezo-electric element according to the present invention comprises the steps of forming a first lower-electrode-forming film, a second lower-electrode-forming film, a piezo-electric film and an upper-electrode-forming film in this order on a substrate through an insulating film, letting second lower electrodes form electrode elements independently of each other on a segment basis by patterning the first and second lower-electrode-forming films, the piezo-electric film and the upper-electrode-forming film, and a forming a passivation film for covering the electrode elements on the substrate where the insulating film and the electrode elements are formed.

Further, a method for producing an actuator with piezo-electric element according to the present invention may include the step of selectively forming a cavity in a position of the substrate corresponding to the position where the second lower electrode is formed in such a manner that the width of the cavity is narrower than the width of the second lower electrode.

Further, a method for producing an actuator with piezo-electric element according to the present invention may include the step of selectively forming a cavity in a position of the substrate corresponding to the position where the lower electrode is formed in such a manner that the width of the cavity is the same as or greater than the width of the second lower electrode.

Further, a method for producing an actuator with piezo-electric element according to the present invention comprises the steps of forming a lower-electrode-forming film, a piezo-electric film and an upper-electrode-forming film in this order on a substrate through an insulating film, forming an electrode element having an opening to which the insulating film is exposed in a desired region other than the region where the piezo-electric film of the lower electrode and the upper electrode are formed, and forming an interlayer insulating film for covering the electrode elements on the substrate where the insulating film and the electrode elements are formed.

Further, a method for producing an actuator with piezo-electric element according to the present invention comprises the steps of forming a lower-electrode-forming film, a piezo-electric film and an upper-electrode-forming film in this order on a substrate through an insulating film, forming an electrode element having an opening to which the insulating film is exposed in a desired region other than the region where the piezo-electric film of the lower electrode and the upper electrode are formed, and forming a passivation film for covering the electrode elements on the substrate where the insulating film and the electrode elements are formed.

Further, a method for producing an actuator with piezo-electric element according to the present invention comprises the steps of forming electrode elements on a substrate each including lower electrodes, piezo-electric films and upper electrodes, forming a passivation film having conductive properties on the substrate where the electrode elements are formed, forming cavities by selectively etching the substrate where the passivation film is formed, and forming wiring formed of the passivation film by patterning the passivation film after forming the cavities.

Through the above-described process, the passivation film is utilizable as a film for use in forming metal wiring. A nickel film may be mentioned as an example of the passivation film.

Further, the step of forming the first lower electrodes may be one of the steps Of forming a nickel film, a titanium film or a titanium oxide film.

Further, the step of forming the second lower electrodes may be the step of forming the titanium film, the titanium oxide film, the titanium film and the platinum film successively.

DETAILED DESCRIPTION OF THE INVENTION

Preferred embodiments of the present invention will be described in detail. In the following embodiments, an actuator with piezo-electric element according to the present invention is used as an actuator in an ink-jet recording head.

Embodiment 1

Figure 1:
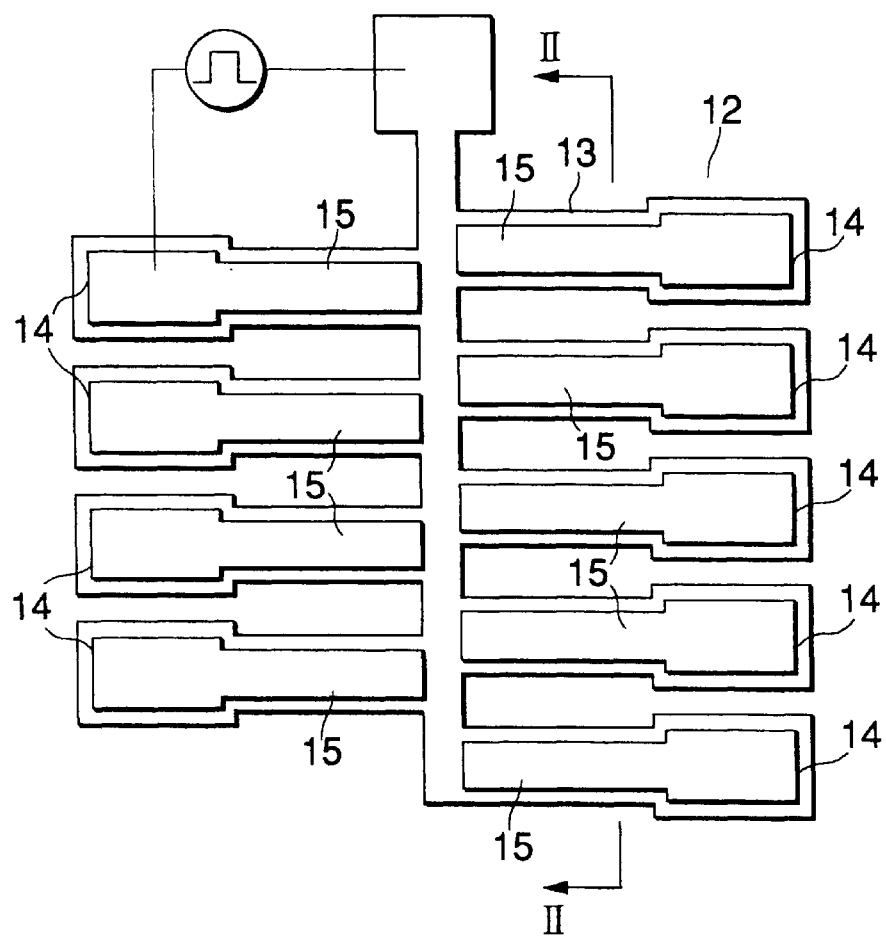
FIG. 1 is a plan view of an ink-jet recording head using an actuator with a piezo-electric element as an actuator according to Embodiment 1 of the present invention.
Figure 2:
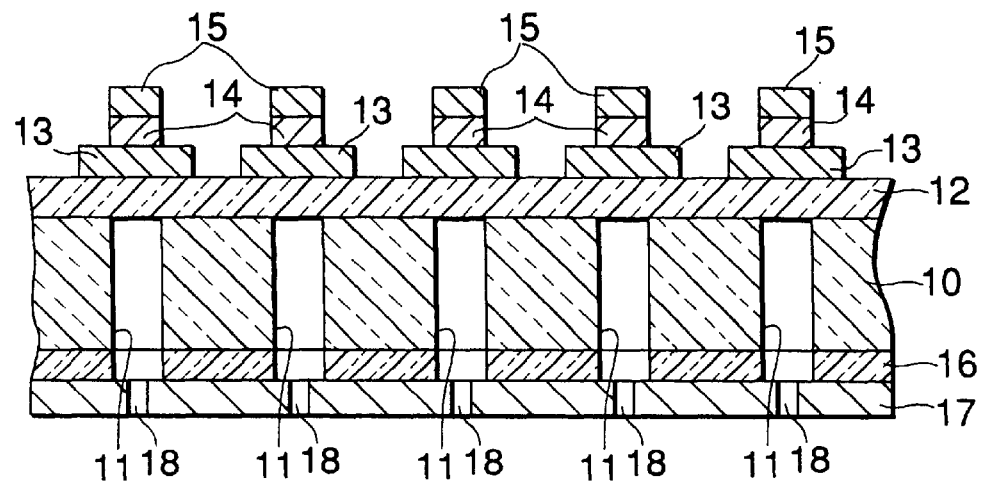
FIG. 2 is a partial sectional view taken along line II—II of FIG. 1.

FIG. 1 is a plan view of an ink-jet recording head with an actuator with a piezo-electric element employed as an actuator according to Embodiment 1 of the present invention; FIG. 2 a sectional view taken along line II—II of FIG. 1; and FIGS. 3(1) to 3(3) are sectional views showing the process steps of producing the ink-jet recording head shown in FIGS. 1 to 2.

As shown in FIGS. 1 to 2, the ink-jet recording head according to Embodiment 1 of the present invention comprises a silicon substrate 10 in which a plurality of ink cavities 11 are formed, lower electrodes 13 provided independently of each other for the respective ink cavities 11 through a silicon oxide film on one side of the silicon substrate 10, PZT (lead titanate zirconate) films 14 formed on the respective lower electrodes 13, upper electrodes 15 formed on the respective PZT films 14, and a nozzle plate 17 provided on the other side of the silicon substrate 10 through a silicon oxide film 16.

The lower electrode 13 is formed over the region of the ink cavity 11 as viewed from the plane. In other words, the width of the lower electrode 13 thus formed is set greater than that of the ink cavity 11. The PZT film 14 and the upper electrode 15 are formed in a position corresponding to that of the ink cavity 11. Further, discharge ports 18 for discharging ink contained in the respective ink cavities 11 are provided in the nozzle plate 17.

A method for manufacturing the ink-jet recording head thus structured will be described with reference to process drawings of FIGS. 3(1) to 3(3).

Figure 3:
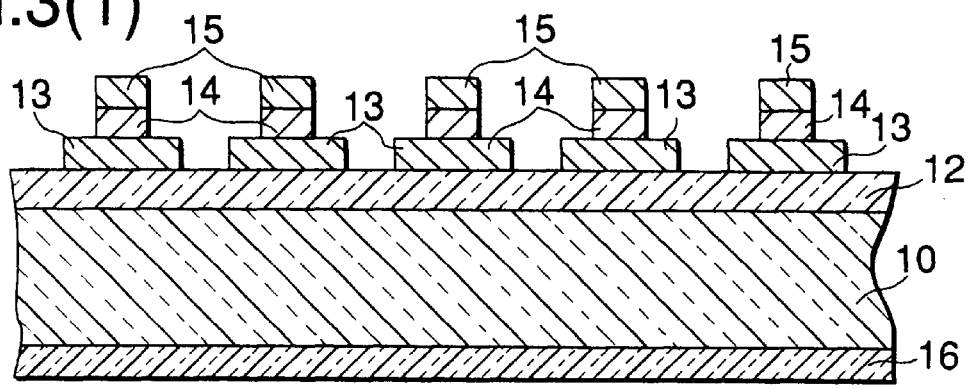
FIGS. 3(1) to 3(3) are sectional views showing a process for manufacturing the ink-jet recording head shown in FIGS. 1 to 2.
Figure 3:
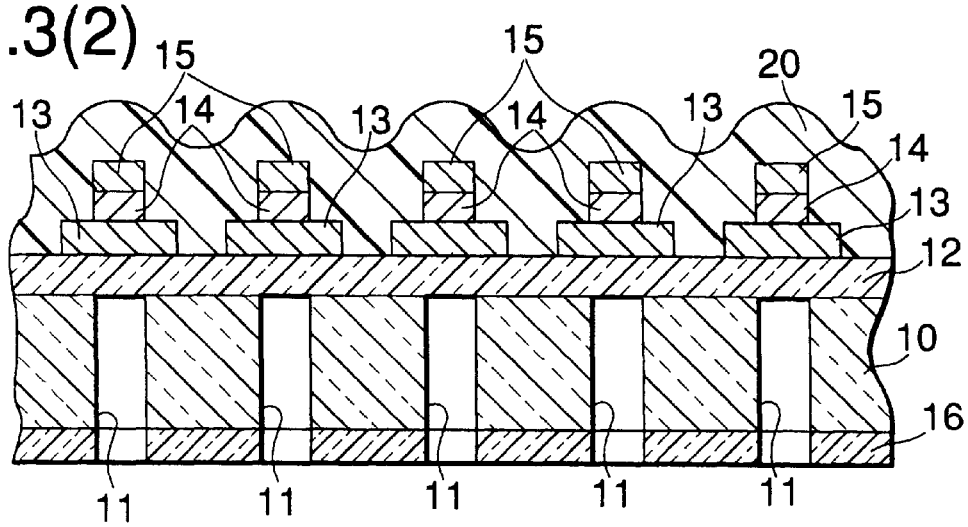
Figure 3:
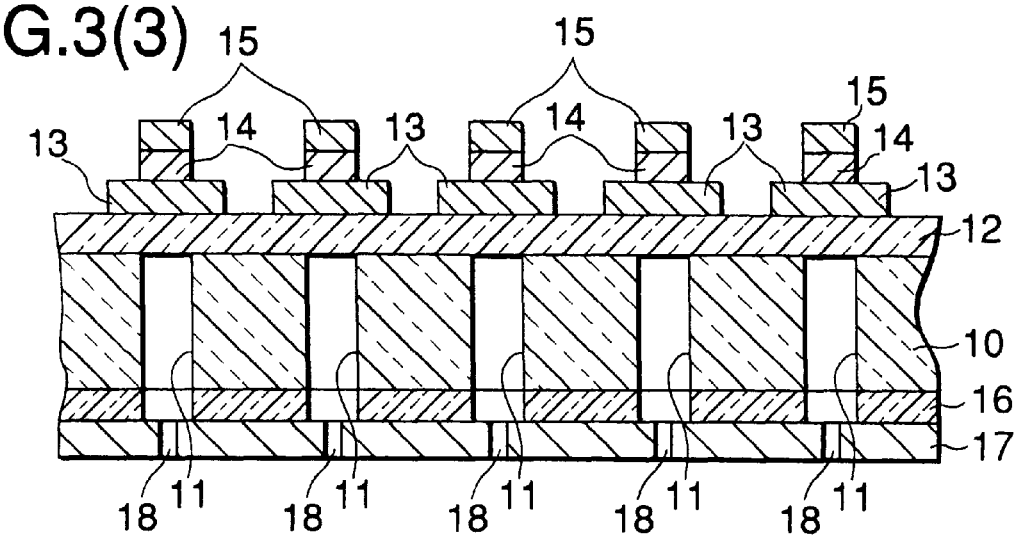

At the step shown in FIG. 3(1), the silicon substrate 10 is subjected to a thermal treatment in an atmosphere of oxygen so as to form the silicon oxide films 12, 16 on the silicon substrate 10. Then a thin metal film for use in forming the lower electrodes 13 is formed by, for example, deposition, sputtering, CVD (Chemical Vapor Deposition) or the like. Further, the film for use in forming the lower electrodes 13 (platinum has been used according to Embodiment 1 of the present invention) is subjected to patterning whereby to form the lower electrodes 13 independently of each other for a plurality of ink cavities 11 (i.e., on a segment basis) to be formed later. When the patterning is conducted, the lower electrode 13 is formed so that its width is greater than that of the ink cavity 11 which is formed later.

One of sol-gel method, sputtering method, deposition method and CVD method is subsequently used to deposit a thin PZT film so that the lower electrode 13 is covered therewith. As a film for use in forming the upper electrodes, a thin metal film containing at least a material selected from the group consisting of aluminum, gold and platinum is deposited on the thin PZT film. Then the upper-electrode-forming film and the thin PZT film are subjected to patterning so as to form the upper electrodes 15 and the PZT films 14.

Since the lower electrodes 13 are thus formed independently of each other for the respective ink cavities 11, the open area of the silicon oxide film is made greater than the case where the lower electrodes not independent of each other are formed.

In this case, platinum as the material used for the lower electrode 13 is poor in reactivity as it is a noble metal and it hardly forms a chemical bond with, for example, a silicon oxide film or a fluoroplastic substance; the problem is that even though the fluoroplastic film or the silicon oxide film is formed as the passivation film or a protective film when the silicon substrate 10 is etched in order to form the ink cavity 11 at the next step on the lower electrode 13 made of platinum which is poor in reactivity, the passivation film will peel off the lower electrode 13 during the etching operation.

As described above, however, the formation of the independent lower electrodes 13 on a segment basis causes the silicon oxide film to be exposed between the segments, whereby the silicon oxide film and the fluoroplastic film or the silicon oxide film as the passivation film are bonded satisfactorily. Therefore, the passivation film is made to adhere securely to both sides of the electrode element even when the adhesion of the element region is insufficient and this makes far greater the covering power than in the conventional piezo-electric element, thus making formable a chemically stable passivation film (an etching protective film according to Embodiment 1 of the present invention). Consequently, ink cavities can be formed without causing damage to the element.

At the step shown in FIG. 3(2), a fluoroplastic passivation film 20 is formed on the surface where the lower electrodes 13, the PZT films 14 and the upper electrodes 15 of the silicon substrate 10 are obtained at the step shown in FIG. 3(1). The passivation film 20 functions as a protective film for the etching conducted to form the ink cavities in the silicon substrate 10. In this case, the adhesion of the passivation film 20 is improved as the passivation film is combined with the silicon oxide film exposed between the segments.

Further, the silicon oxide film 16 and subsequently the silicon substrate 10 are selectively etched with a potassium hydroxide aqueous solution, so that the ink cavities 11 are formed in the silicon substrate 10. As the width of the lower electrode 13 is set greater than that of the ink cavity 11 at this time, the hydrogen produced by the etching is prevented from reaching the PZT film 14. Thus, a reliable PZT film is obtained.

At the step shown in FIG. 3(3), the passivation film 20 is removed. Further, the nozzle plate 17 formed with the discharge ports 18 is provided through the silicon oxide film 16 on the side where the silicon oxide film 16 of the silicon substrate 10 is formed. Then the predetermined steps are followed to complete the ink-jet recording head.

Although use has been made of fluoroplastics as the passivation film in Embodiment 1 of the present invention, any other material such as silicon oxide, epoxy resin or the like may be employed as long as it is effective as the passivation film.

Moreover, the following step may be substituted for that shown in FIG. 3(1). More specifically, the silicon substrate 10 is subjected to heat treatment in an atmosphere of oxygen and the silicon oxide films 12, 16 are each formed on one and other sides of the silicon substrate 10. Further, a film for use in forming the lower electrodes, a thin PZT film and a film for use in forming the upper electrodes are formed successively. Further, the upper electrodes 15 and the PZT films 14 are formed by patterning the film for use in the upper electrodes and the thin PZT film. Then the lower electrodes 13 are formed by patterning the film for use in forming the lower electrodes. At this time, the patterning of the film for use in forming the lower electrodes is carried out so that the lower electrodes 13 are formed independently of each other respectively for a plurality of ink cavities 11 which are formed later (i.e., on a segment basis).

Embodiment 2

Referring to the drawing, Embodiment 2 of the present invention will be described, wherein like reference characters designate like members in Embodiment 1 thereof and the detailed description thereof will be omitted.

Figure 4:
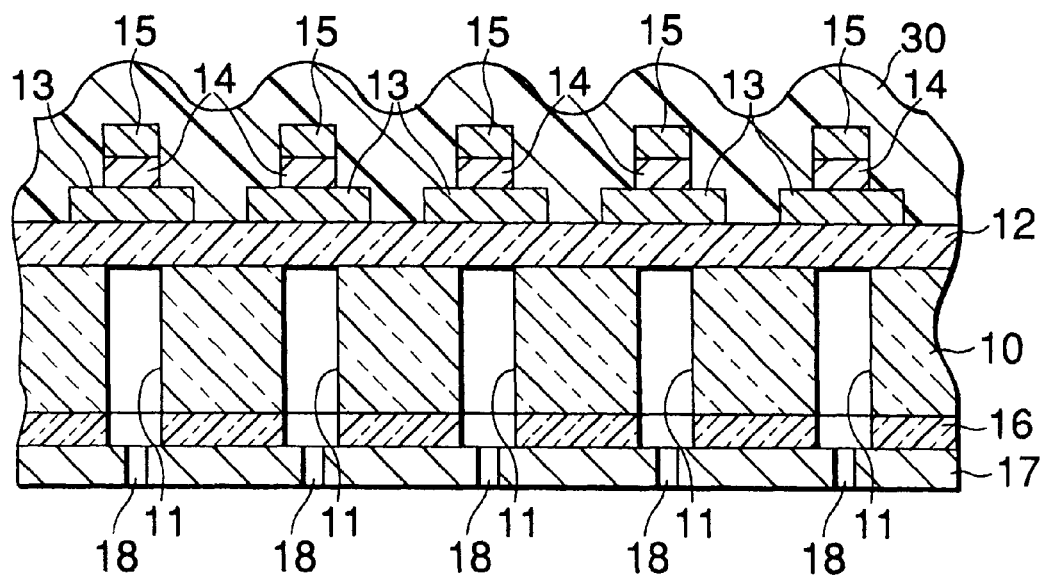
FIG. 4 is a partial sectional view of an ink-jet recording head using an actuator with a piezo-electric element as an actuator according to Embodiment 2 of the present invention.

FIG. 4 is a partial sectional view of an ink-jet recording head with an actuator with piezo-electric element employed as an actuator according to Embodiment 2 of the present invention.

The ink-jet recording head according to Embodiment 2 of the present invention is different from what is defined according to Embodiment 1 thereof in that a passivation film 30 is formed as a final protective film. As in Embodiment 1 of the present invention, the adhesion of this passivation film 30 is also improved because a portion kept in contact with the silicon oxide film 12 is secured. In this case, various films such as a polyimide film, a silicon oxide film, a fluoroplastic film and so forth, usable as a protective film are usable as this passivation film.

The passivation film 20 may be substituted for the passivation film 30 without removing the former formed at the step of FIG. 3(2) or otherwise the latter may be formed newly by removing the former.

Although a description has been given of the case where the width of the lower electrode 13 is set greater than that of the ink cavity 11 in Embodiment 2 of the present invention, the width of the lower electrode 13 may be the same as or narrower than that of the ink cavity 11.

Embodiment 3

Referring to the Drawings, Embodiment 3 of the present invention will be described, wherein like reference characters designate like members in the preceding embodiments thereof and the detailed description thereof will be omitted.

Figure 5:
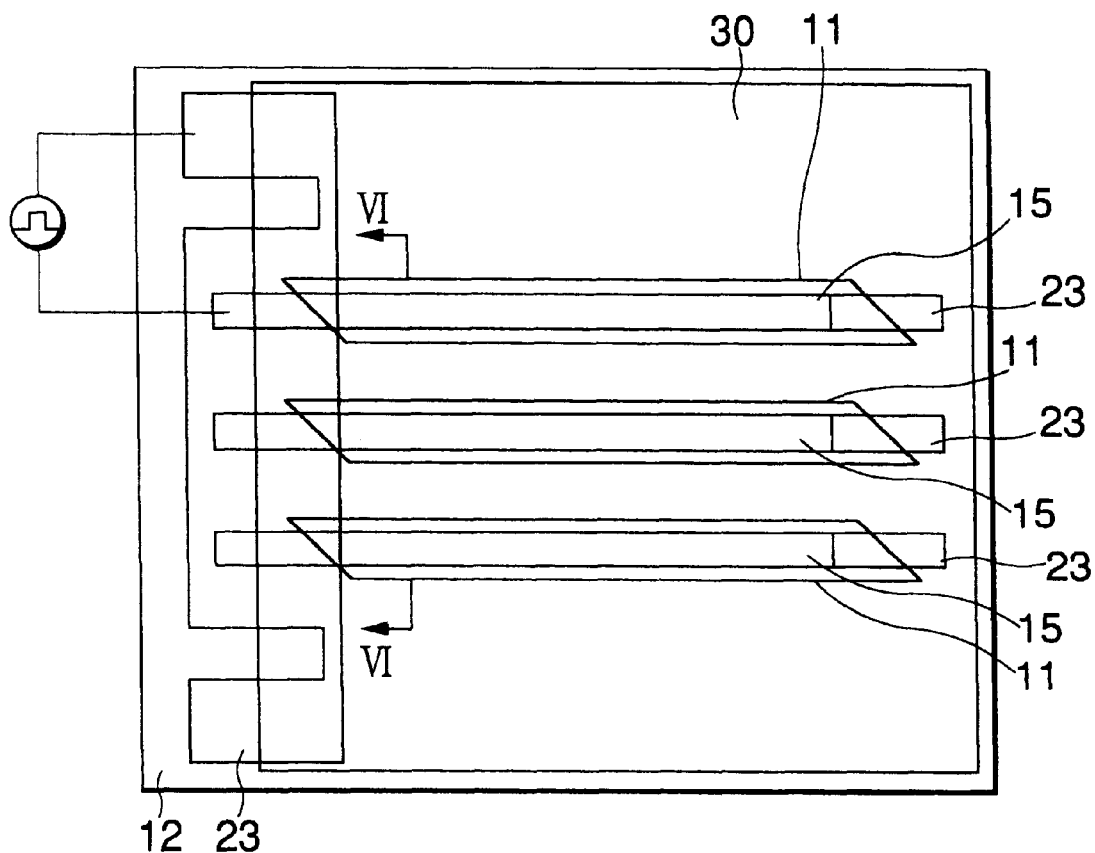
FIG. 5 is a plan view of an ink-jet recording head using an actuator with a piezo-electric element as an actuator according to Embodiment 3 of the present invention.
Figure 6:
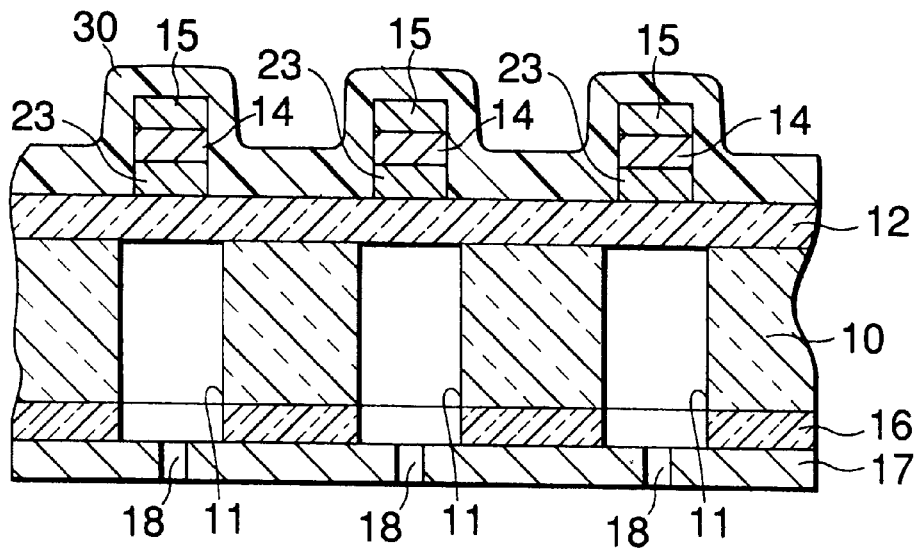
FIG. 6 is a sectional view taken along line VI—VI of FIG. 5.

FIG. 5 is a plan view of an ink-jet recording head with an actuator with a piezo-electric element employed as an actuator according to Embodiment 3 of the present invention; and FIG. 6 a sectional view taken on line VI—VI of FIG. 5.

The ink-jet recording head according to Embodiment 3 of the present invention is similar in structure to the ink-jet recording head according to Embodiment 2 thereof except that the width of the lower electrode 23 of the piezo-electric element is narrower than that of the ink cavity 11.

As the piezo-electric element of the ink-jet recording head is thus structured, it features a strong vibration obtainable when the PZT film 14 is displaced by applying voltage thereto because the piezo-electric film is so structured as to have no lower electrode 23 formed in a part of the region of the diaphragm disposed in the upper portion (in FIG. 6) of the ink cavity 11, to say nothing of improved adhesion of the passivation film 30. Consequently, ink can be jetted out of the discharge port 18 at high speed.

Embodiment 4

Referring to the drawings, Embodiment 4 of the present invention will be described, wherein like reference characters designate like members in the preceding embodiments thereof and the detailed description thereof will be omitted.

Figure 7:
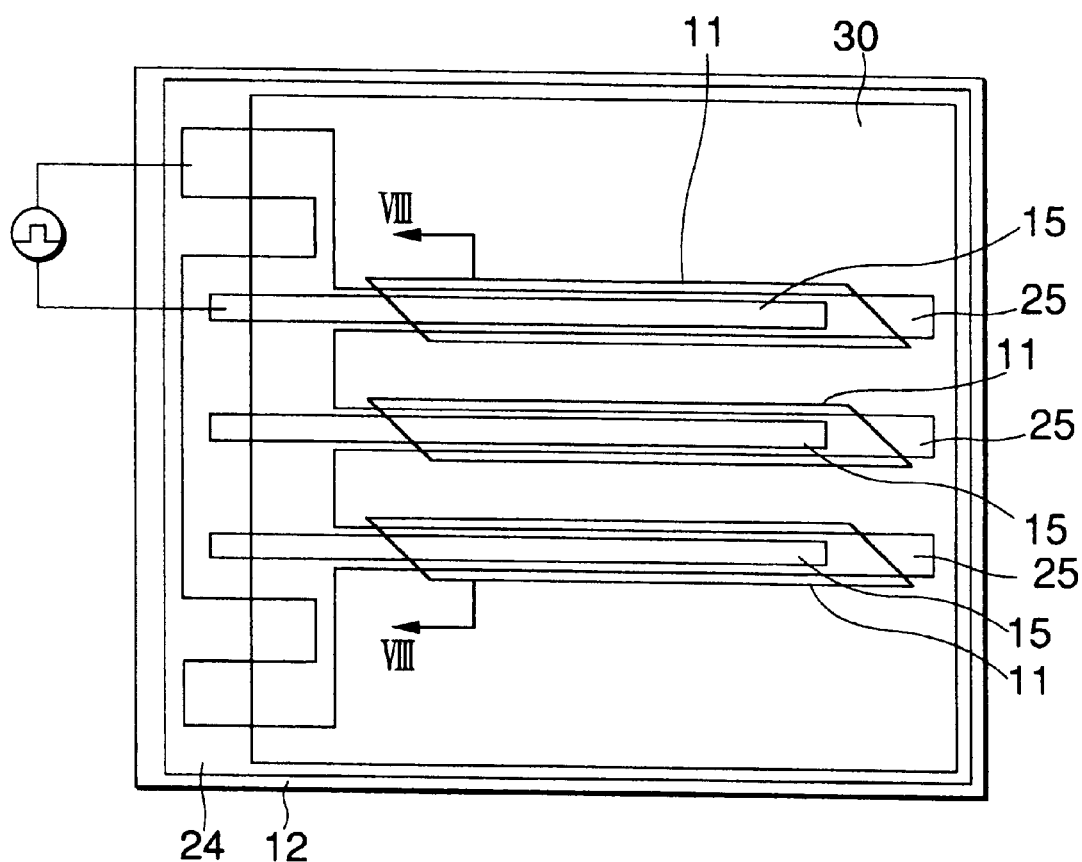
FIG. 7 is a plan view of an ink-jet recording head using an actuator with a piezo-electric element as an actuator according to Embodiment 4 of the present invention.
Figure 8:
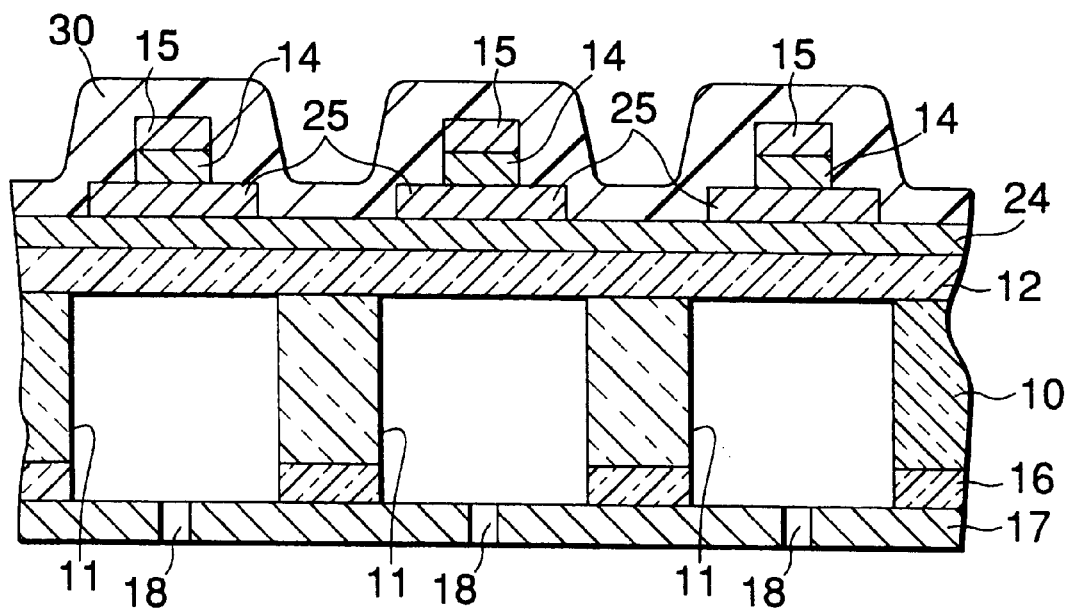
FIG. 8 is a sectional view taken on line VIII—VIII of FIG. 7.
Figure 9:
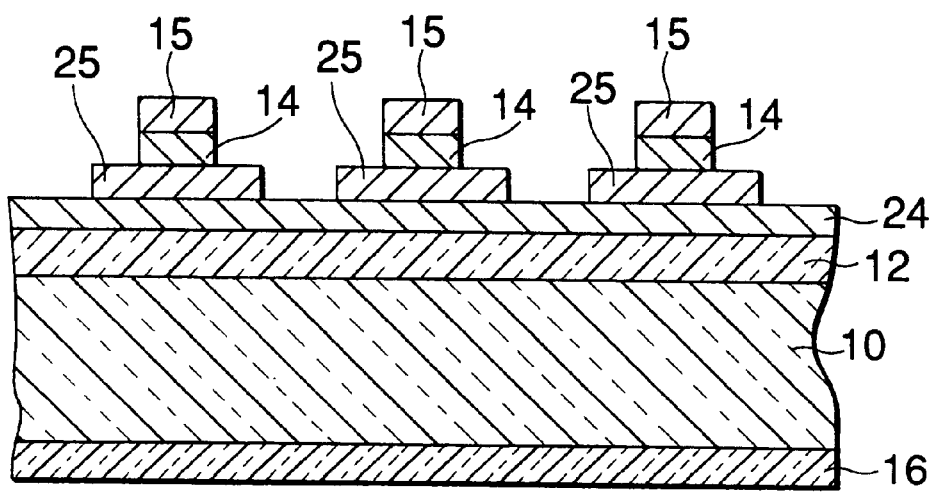
FIG. 9 is a partial sectional view showing a process for manufacturing an ink-jet recording head shown in FIGS. 7–8.

FIG. 7 is a plan view of an ink-jet recording head with an actuator with piezo-electric element employed as an actuator according to Embodiment 4 of the present invention; FIG. 8 is a sectional view taken along line VII—VII of FIG. 7; and FIG. 9 is a sectional view partially showing the steps of manufacturing the ink-jet recording head shown in FIGS. 7 to 8.

In the ink-jet recording head according to Embodiment 4 of the present invention, the lower electrode of the ink-jet recording head according to Embodiment 2 of the present invention is formed with a first and a second lower electrode 24, 25.

The piezo-electric element of the ink-jet recording head according to Embodiment 4 of the present invention comprises the first lower electrode 24 of a nickel film formed on the silicon oxide film 12, the second lower electrodes 25 of platinum films formed independently of each other on an ink cavity 11 basis on the first lower electrodes 24, the PZT films 14 formed on the respective second lower electrodes 25, the upper electrodes 15 formed on the respective PZT films 14, and the nozzle plate 17 provided on the other side of the silicon substrate 10 through the silicon oxide film 16.

The ink cavity 11 is formed over the region of the second lower electrode 25 as viewed from the plane. In other words, the width of the second lower electrode 25 thus formed is set narrower than that of the ink cavity 11. The first lower electrode 24 is exposed in between the second lower electrode 25 and what is adjacent thereto.

In the ink-jet recording head thus structured, a portion where the passivation film 30 contacts the first lower electrode 24 is secured. In this case, the first lower electrode 24 is formed of a nickel film whose adhesion to the passivation film 30 is excellent. Therefore, the adhesion of the passivation film 30 can be improved. Moreover, the adhesion of the silicon oxide film 12 to the first lower electrode 24 is also improved.

In Embodiment 4 of the present invention, moreover, the lower electrode thus structured makes low resistance also attainable.

In this case, any conductive material, in the form of a titanium film, an iridium or the like in addition to the nickel film, other than platinum or platinum alloy may be chosen for the first lower electrode 24.

Referring to FIG. 9, a process for producing the ink-jet recording head thus structured will be described.

At the step shown in FIG. 9, the silicon oxide films 12, 16 are each formed on one side and the other side of the silicon substrate 10 through a process similar to that shown in FIG.

3(1), the nickel films and the platinum films being then formed on the silicon substrate 10 successively. Further, the nickel films and the platinum films are subjected to patterning, which is conducted in such a way as to make the platinum films independent of each other with respect to a plurality of ink cavities 11 to be formed later (i.e., on a segment basis) and besides the width of the platinum film is narrower than that of the ink cavity 11. Thus, the first lower electrode 24 formed of the nickel film and the second lower electrode 25 formed of the platinum film are provided.

Next, the PZT film 14 and the upper electrode 15 are formed on the lower electrodes by a process similar to that shown in FIG. 3(1).

Then the steps shown in FIGS. 3(2) to 3(3) are followed and the passivation film 30 is formed according to this embodiment of the present invention like Embodiment 2 thereof.

Although a description has been given of the case where the width of the second lower electrode 25 is set narrower than that of the ink cavity 11 according to Embodiment 4 of the present invention, the width of the second lower electrode 25 may be the same as that of ink cavity 11.

Embodiment 5

Referring to the drawings, Embodiment 5 of the present invention will be described, wherein like reference characters designate like members in the preceding embodiments thereof and the detailed description thereof will be omitted.

Figure 10:
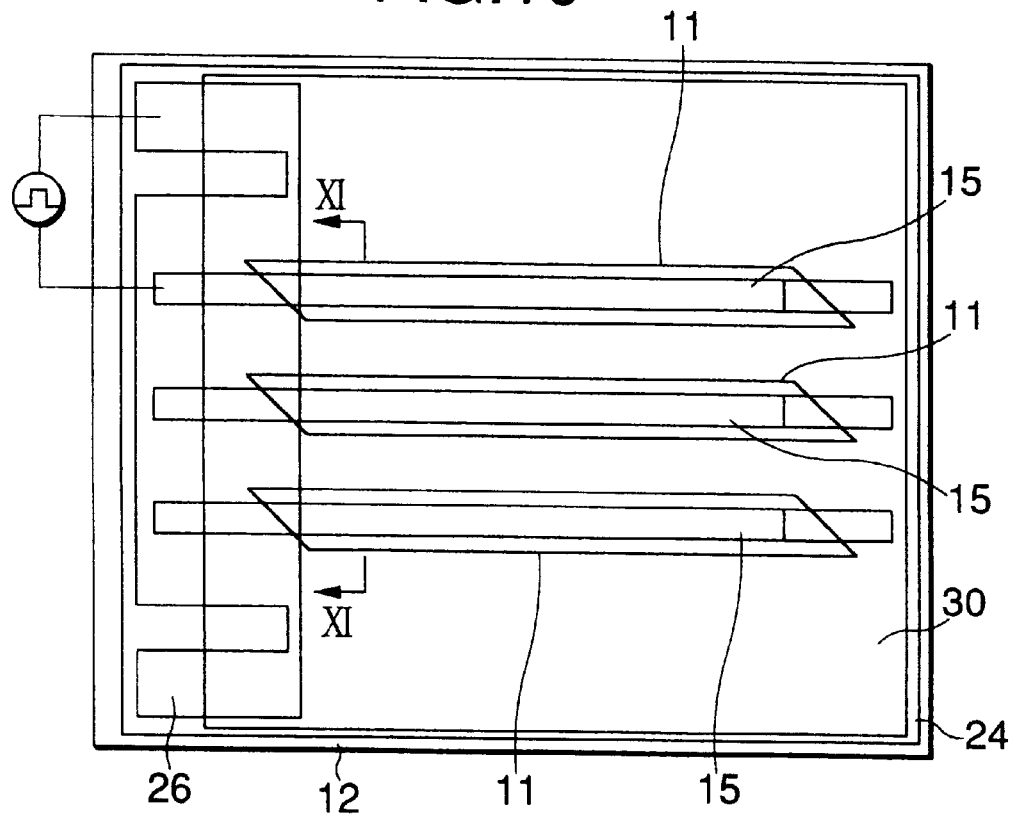
FIG. 10 is a plan view of an ink-jet recording head using an actuator with a piezo-electric element as an actuator according to Embodiment 5 of the present invention.
Figure 11:
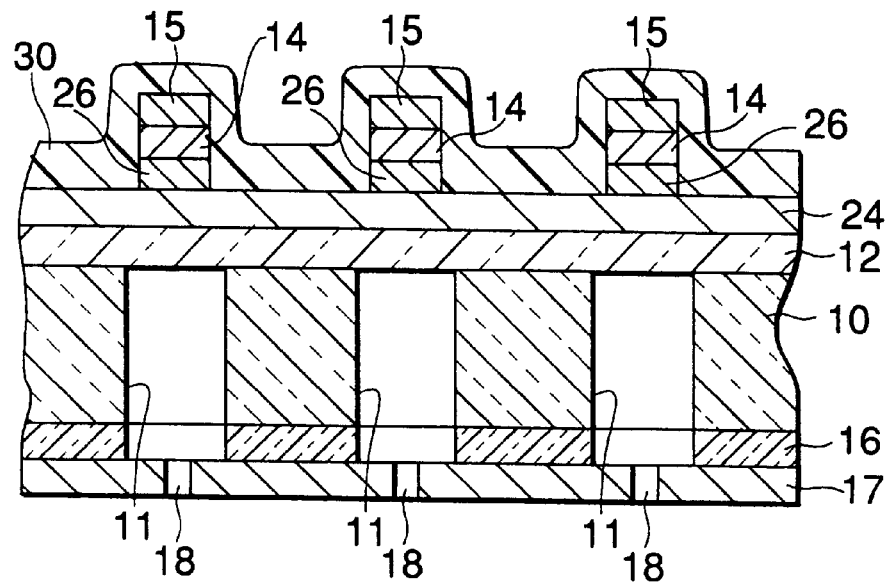
FIG. 11 is a sectional view taken on line XI—XI of FIG. 10.

FIG. 10 is a plan view of an ink-jet recording head with an actuator with a piezo-electric element employed as an actuator according to Embodiment 5 of the present invention; and FIG. 11 a sectional view taken along line XI—XI of FIG. 10.

The ink-jet recording head according to Embodiment 5 of the present invention is similar in structure to the ink-jet recording head according to Embodiment 4 thereof except that the width of each lower electrode 26 is narrower than or the same as that of the ink cavity 11.

In the piezo-electric element of the ink-jet recording head thus structured, a strong vibration is obtainable when the PZT film 14 is displaced by applying voltage thereto because the piezo-electric film is so structured as to have no second lower electrode 26 formed in a part of the region of the diaphragm disposed in the upper portion of the ink cavity 11, in addition to the function and effect achievable according to Embodiment 4 of the present invention. Consequently, ink can be jetted out of the discharge port 18 at high speed.

Embodiment 6

Referring to the drawings, Embodiment 6 of the present invention will be described, wherein like reference characters designate like members in the preceding embodiments thereof and the detailed description thereof will be omitted.

Figure 12:
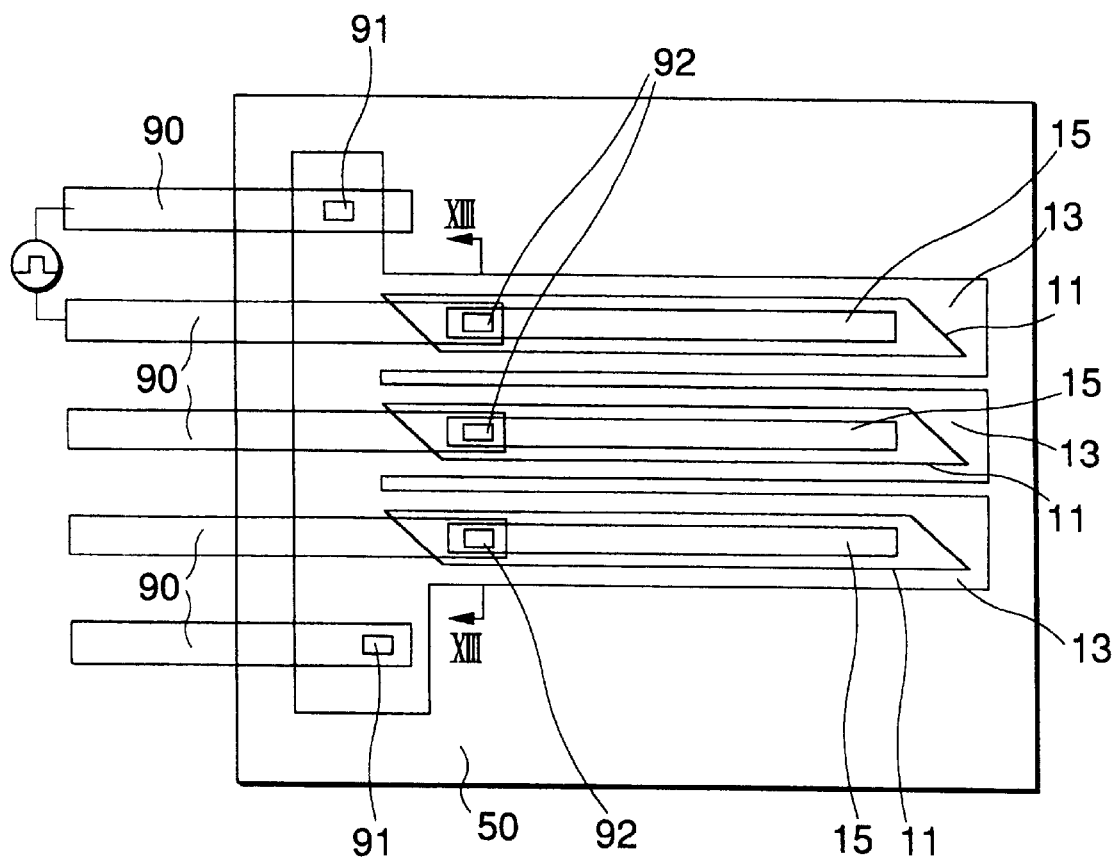
FIG. 12 is a plan view of an ink-jet recording head using an actuator with a piezo-electric element as an actuator according to Embodiment 6 of the present invention.
Figure 13:
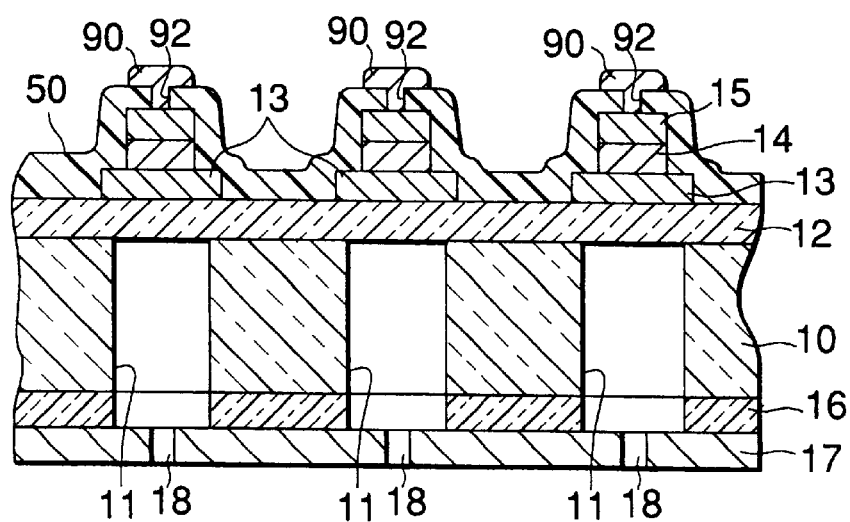
FIG. 13 is a sectional view taken on line XIII—XIII of FIG. 12.

FIG. 12 is a plan view of an ink-jet recording head with an actuator with a piezo-electric element employed as an actuator according to Embodiment 6 of the present invention; FIG. 13 is a sectional view taken along line XIII—XIII of FIG. 12; and FIGS. 14(1) to 14(3) are sectional views partially showing the steps of manufacturing the ink-jet recording head shown in FIGS. 12 to 13.

The piezo-electric element of the ink-jet recording head according to Embodiment 6 of the present invention comprises the silicon substrate 10 having a plurality of ink cavities 11, the lower electrodes 13 formed independently of each other for the respective ink cavities 11 through the silicon oxide film 12 on one side of the silicon substrate 10, the width of the lower electrode 13 being greater than that of the ink cavity 11, PZT films 14 formed on the respective lower electrodes 13, upper electrodes 15 formed on the respective PZT films 14, an interlayer insulating film 50 formed thereon, wiring 90 electrically connected to the upper electrodes 15 through contact holes 92 opened in the interlayer insulating film 50, and the nozzle plate 17 formed on the other side of the silicon substrate 10 through the silicon oxide film 16.

Since the lower electrodes 13 are formed independently of each other on an ink cavity 11 basis in the ink-jet recording head thus structured, the silicon oxide film 12 is exposed in between the lower electrode 13 and what is adjacent thereto, so that a portion where the silicon oxide film 12 contacts the interlayer insulating film 50 is secured. Therefore, the adhesion of the interlayer insulating film 50 is improvable.

Moreover, a passivation film may be formed on top of the whole layer of the ink-jet recording head of FIG. 13.

Next, a process for manufacturing the ink-jet recording head thus structured will be described with reference to FIGS. 14(1) to 14(3).

At the step shown in FIG. 14(1), like those shown in FIG. 3(1), the silicon oxide films 12, 16 are each formed on one side and the other side of the silicon substrate 10, and the lower electrodes 13, the PZT films 14 and the upper electrodes 15 are successively formed on the silicon oxide film 12, the lower electrodes 13 being formed independently of each other for the plurality of ink cavities to be formed later, the width of the lower electrode 13 being greater than that of the ink cavity 11.

Figure 14:
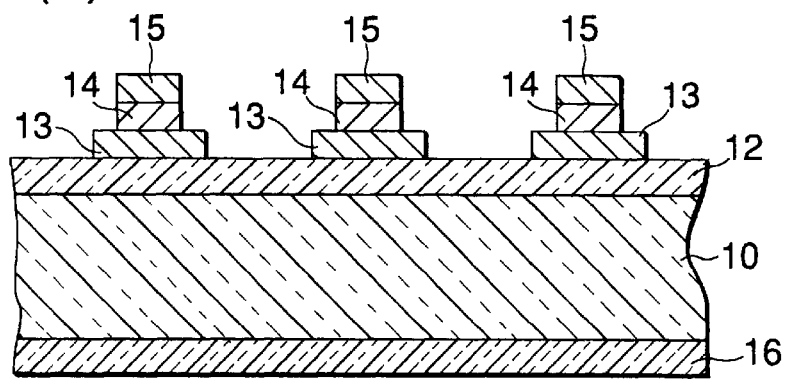
FIGS. 14(1) to 14(3) are partial sectional views showing a process for manufacturing an ink-jet recording head shown in FIGS. 12 to 13.
Figure 14:
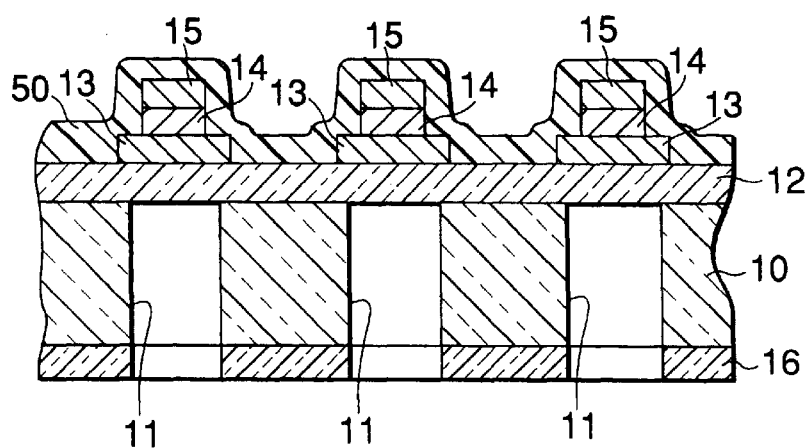
Figure 14:
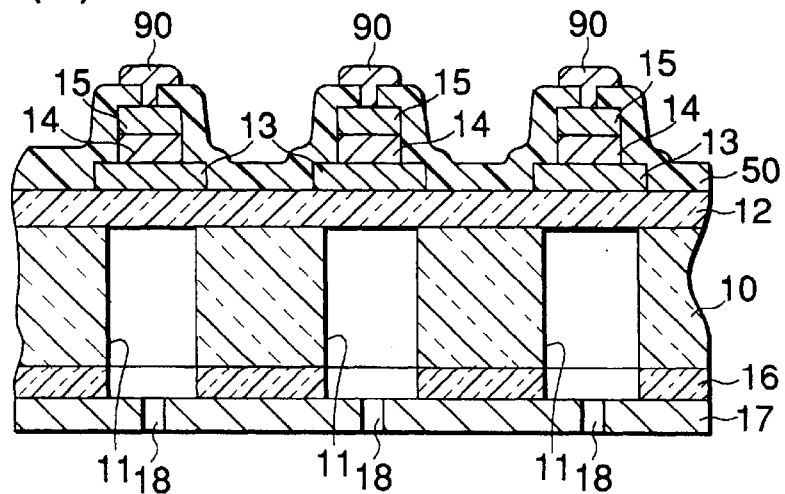

At the step shown in FIG. 14(2), like those shown in FIG. 3(2), a passivation film (not shown) for use in forming the ink cavities 11 is removed after the ink cavities are formed. Further, the interlayer insulating film 50 is formed on the silicon substrate 10. At this time, use can be made of any film, for example, a polyimide film, a silicon oxide film and the like usable as the interlayer insulating film 50.

At the step shown in FIG. 14(3), a contact hole 92 is selectively formed in a predetermined position where the upper electrode of the interlayer insulating film 50 obtained in FIG. 14(2) is formed. Further, the wiring 90 electrically connected to the upper electrodes 15 is formed on and through the respective contact holes 90. Then the predetermined steps like those shown in FIG. 3(3) are followed to provide the nozzle plate 17 with the discharge ports 18 formed therein and the like so as to complete the ink-jet recording head.

Although a description has been given of the case where the width of the lower electrode 13 is set greater than that of the ink cavity 11, the width of the former may be the same as that of the ink cavity 11.

Embodiment 7

Referring to the drawings, Embodiment 7 of the present invention will be described, wherein like reference characters designate like members in the preceding embodiments thereof and the detailed description thereof will be omitted.

Figure 15:
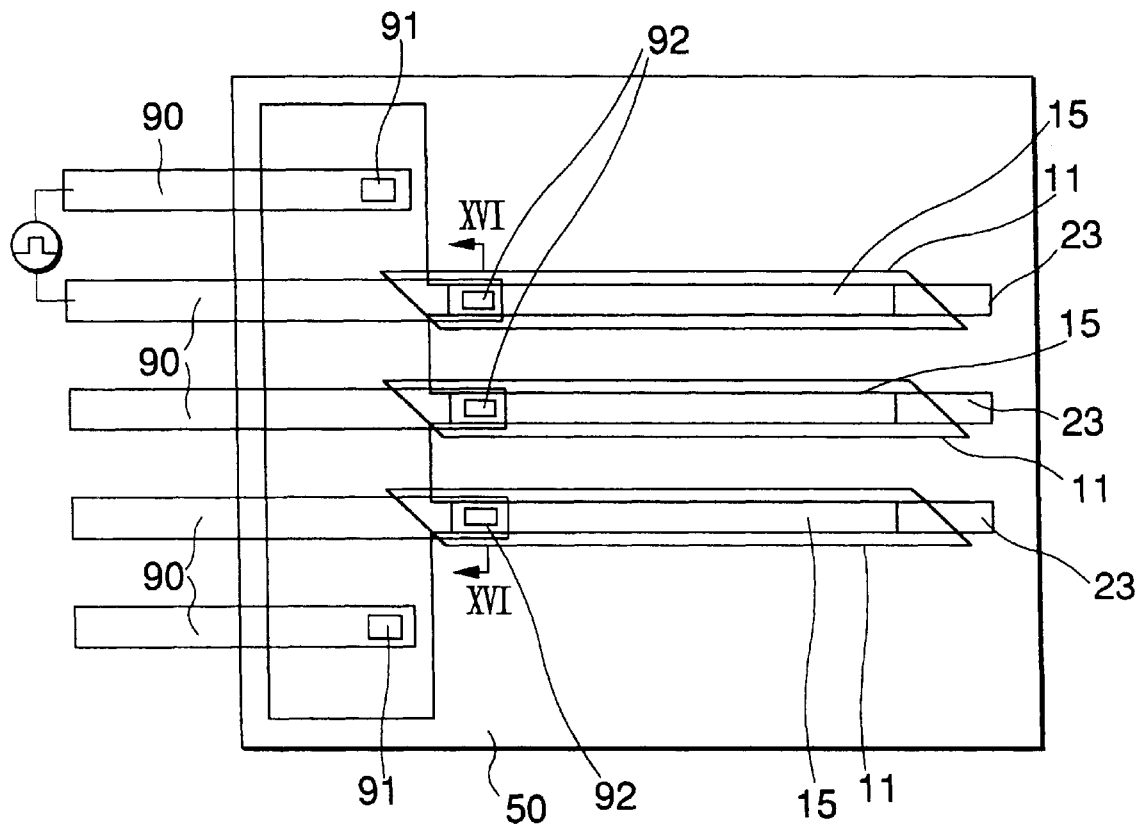
FIG. 15 is a plan view of an ink-jet recording head using an actuator with a piezo-electric element as an actuator according to Embodiment 7 of the present invention.
Figure 16:
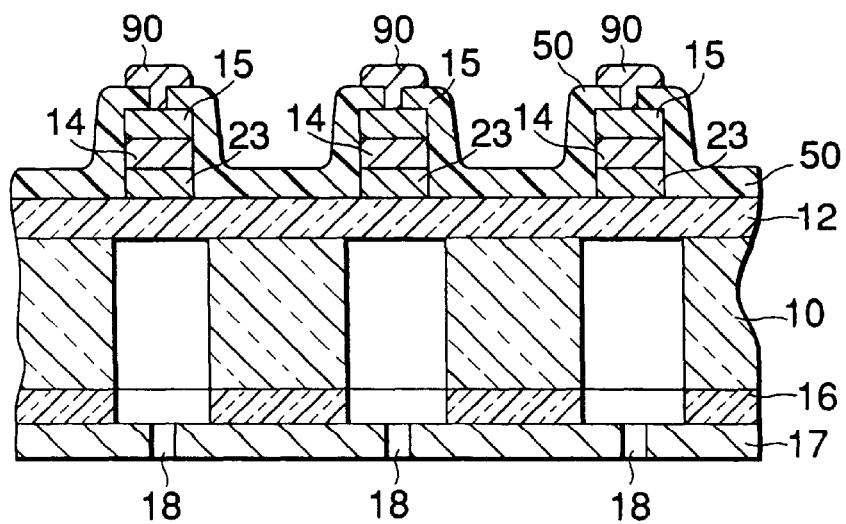
FIG. 16 is a sectional view taken on line XVI—XVI of FIG. 15.

FIG. 15 is a plan view of an ink-jet recording head with an actuator with a piezo-electric element employed as an actuator according to Embodiment 7 of the present invention; and FIG. 16 a sectional view taken along line XVI—XVI of FIG. 16.

The ink-jet recording head according to Embodiment 7 of the present invention is similar in structure to the ink-jet recording head according to Embodiment 6 thereof except that the width of the lower electrode 23 of the piezo-electric element is narrower than that of the ink cavity 11.

As the piezo-electric element of the ink-jet recording head is thus structured, it features a strong vibration obtainable when the PZT film 14 is displaced by applying voltage thereto since the piezo-electric film is so structured as to have no lower electrode 23 formed in a part of the region of the diaphragm disposed in the upper portion of the ink cavity 11, to say nothing of improved adhesion of the interlayer insulating film 50. Consequently, ink can be jetted out of the discharge port 18 at high speed.

Moreover, a passivation film may be formed on top of the whole layer of the ink-jet recording head shown in FIGS. 15 to 16.

Embodiment 8

Referring to the drawings, Embodiment 8 of the present invention will be described, wherein like reference characters designate like members in the preceding embodiments thereof and the detailed description thereof will be omitted.

Figure 17:
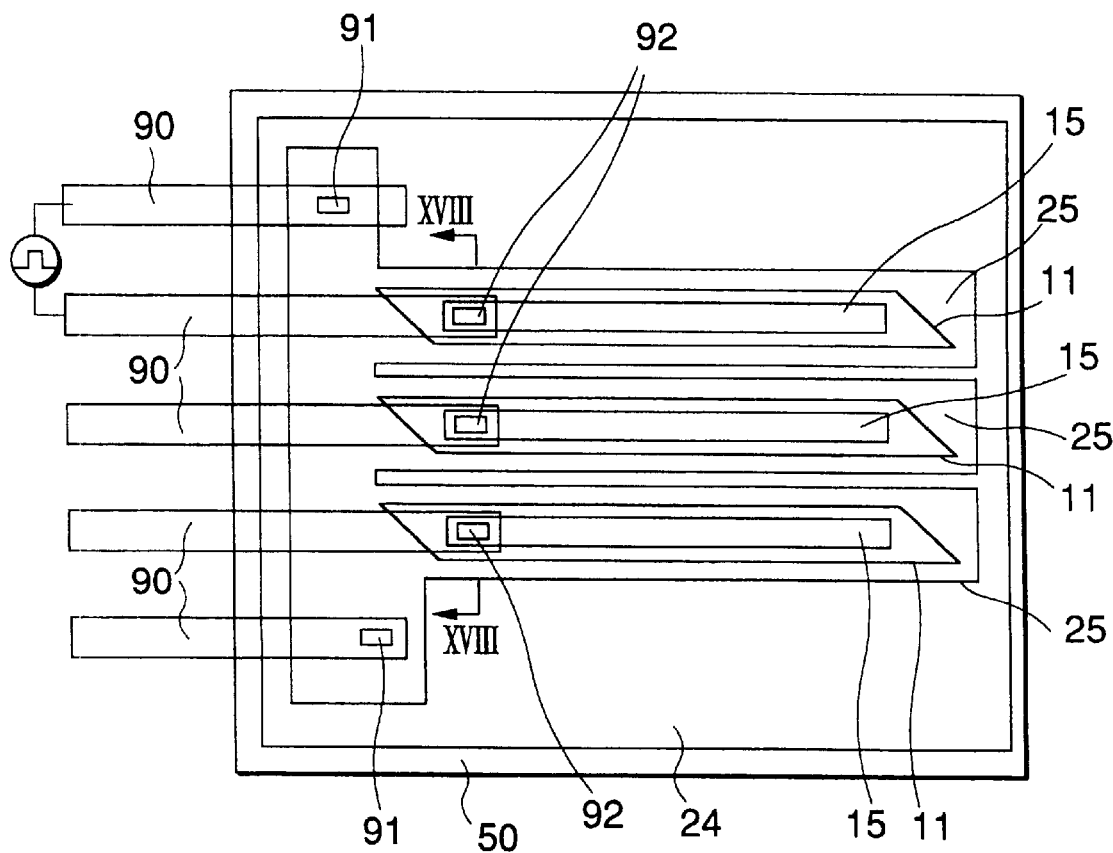
FIG. 17 is a plan view of an ink-jet recording head using an actuator with a piezo-electric element as an actuator according to Embodiment 8 of the present invention.
Figure 18:
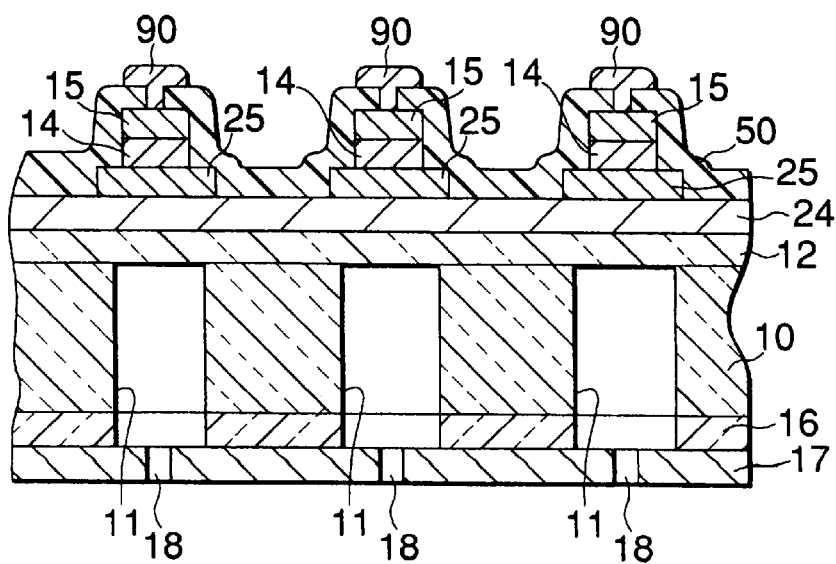
FIG. 18 is a sectional view taken on line XVIII—XVIII of FIG. 17.

FIG. 17 is a plan view of an ink-jet recording head with an actuator with a piezo-electric element employed as an actuator according to Embodiment 7 of the present invention; and FIG. 18 is a sectional view taken along line XVIII—XVIII of FIG. 17.

In the ink-jet recording head according to Embodiment 8 of the present invention, the lower electrode of the ink-jet recording head according to Embodiment 6 of the present invention is constituted of the first and second lower electrodes 24, 25.

The piezo-electric element of the ink-jet recording head according to Embodiment 8 of the present invention comprises the first lower electrodes 24 of nickel films formed on the silicon oxide film 12, the second lower electrodes 25 formed on the first lower electrodes 24 independently of each other for the respective ink cavities 11, the PZT films 14 formed on the respective second lower electrodes 25, the upper electrodes 15 formed on the respective PZT films 14, the interlayer insulating film 50 formed thereon, the wiring 90 electrically connected to the upper electrodes 15 through the contact holes 92 opened in the interlayer insulating film 50, and the nozzle plate 17 provided on the other side of the silicon substrate 10 through the silicon oxide film 16.

The second lower electrode 25 is formed over the region of the ink cavity 11 as viewed from the plane. In other words, the width of the second lower electrode 25 thus formed is set greater than that of the ink cavity 11. The first lower electrode 24 is exposed in between the second lower electrode 25 and what is adjacent thereto.

In the ink-jet recording head thus structured, a portion where the interlayer insulating film 50 is kept in contact with the first lower electrode 24 is secured. In this case, the first lower electrode 24 is formed of a nickel film is whose adhesion to the interlayer insulating film 50 is excellent. Therefore, the adhesion of the interlayer insulating film 50 can be improved.

A process for manufacturing the ink-jet recording head thus structured, which is similar to that shown in FIG. 9, comprises the steps of forming the silicon oxide films 12, 16 each on one side and the other side of the silicon substrate 10, forming the first silicon oxide films 24 of nickel films and the second lower electrodes 25 of platinum films on the silicon oxide film 12, and forming the PZT films 14 and the upper electrodes 15 thereon.

Than the same steps as those shown in FIGS. 14(2) to 14(3) are followed to complete the ink-jet recording head.

Although a description has been given of the case where the width of the second lower electrode 25 is set greater than that of the ink cavity 11, the width of the former may be the same as that of the ink cavity 11.

Moreover, a passivation film may be formed on top of the whole layer of the ink-jet recording head shown in FIGS. 17 to 18.

Embodiment 9

Referring to the drawings, Embodiment 9 of the present invention will be described, wherein like reference characters designate like members in the preceding embodiments thereof and the detailed description thereof will be omitted.

Figure 19:
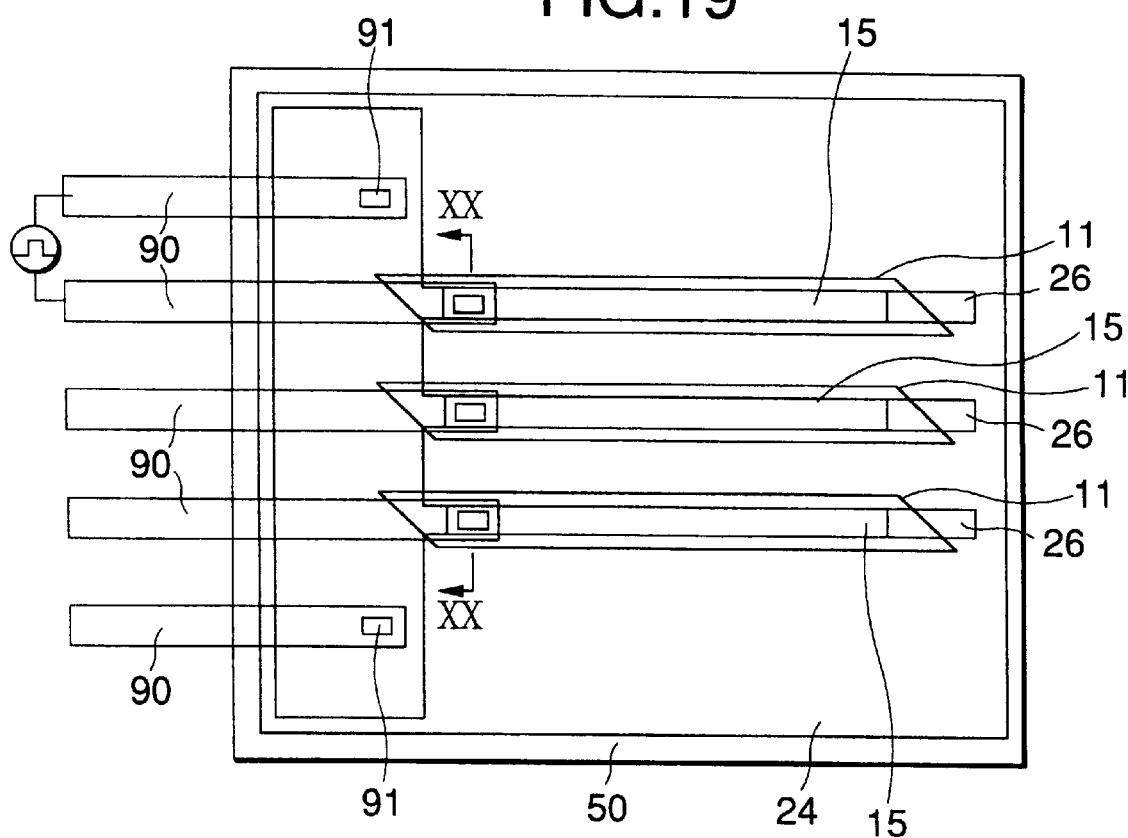
FIG. 19 is a plan view of an ink-jet recording head using an actuator with a piezo-electric element as an actuator according to Embodiment 9 of the present invention.
Figure 20:
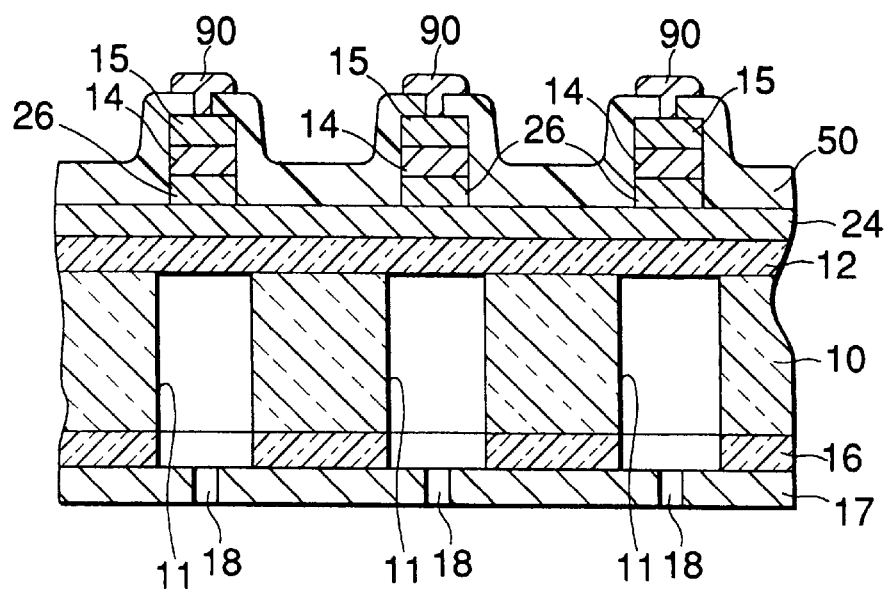
FIG. 20 is a sectional view taken on line XX—XX of FIG. 19.

FIG. 19 is a plan view of an ink-jet recording head with an actuator with a piezo-electric element employed as an actuator according to Embodiment 7 of the present invention; and FIG. 20 is a sectional view taken along line XX—XX of FIG. 19.

The ink-jet recording head according to Embodiment 9 of the present invention is similar in structure to the ink-jet recording head according to Embodiment 8 thereof except that the width of the second lower electrode 26 is narrower than that of the ink cavity 11.

In the piezo-electric element of the ink-jet recording head thus structured, a strong vibration is obtainable when the PZT film 14 is displaced by applying voltage thereto because the piezo-electric film is so structured as to have no second lower electrode 26 formed in a part of the region of the diaphragm disposed in the upper portion of the ink cavity 11, in addition to the function and effect achievable according to Embodiment 8 of the present invention. Consequently, ink can be jetted out of the discharge port 18 at high speed.

Moreover, a passivation film may be formed on top of the whole layer of the ink-jet recording head shown in FIGS. 19–20.

Embodiment 10

Referring to the drawing, Embodiment 10 of the present invention will be described, wherein like reference characters designate like members in the preceding embodiments thereof and the detailed description thereof will be omitted.

Figure 21:
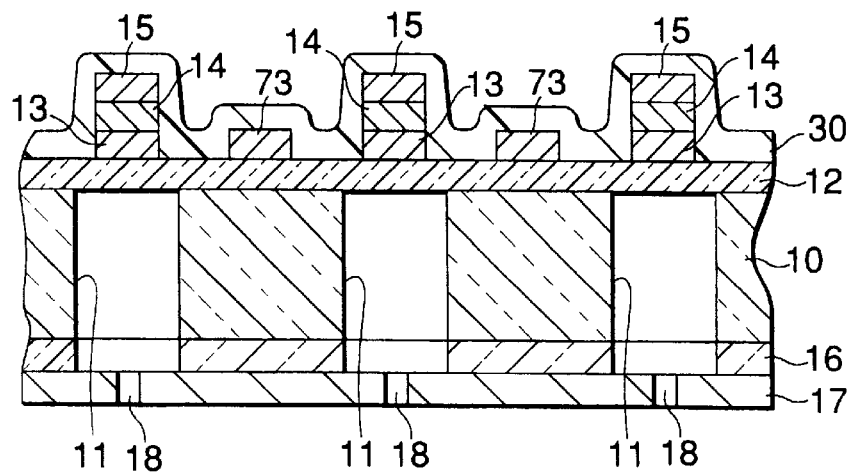
FIG. 21 is a partial sectional view of an ink-jet recording head according to Embodiment 10 of the present invention.

FIG. 21 is a partial sectional view of an ink-jet recording head according to Embodiment 10 of the present invention.

The ink-jet recording head shown in FIG. 21 includes a platinum film situated in between segment-to-segment independent elements of the ink-jet recording head described in Embodiment 3 , and wiring 73 connected to the lower electrode 13. As a portion where the passivation film 30 contacts the silicon oxide film 12 is secured even in the structure like this, the adhesion of the passivation film 30 is made improvable and the resistance of the lower electrode 13 is also made reducible thereby.

Incidentally, the structure with the wiring 73 formed in between the segment-to-segment independent elements may be applicable to the other preceding embodiments of the present invention described above.

Embodiment 11

Referring to the drawings, Embodiment 11 of the present invention will be described, wherein like reference characters designate like members in the preceding embodiments thereof and the detailed description thereof will be omitted.

Figure 22:
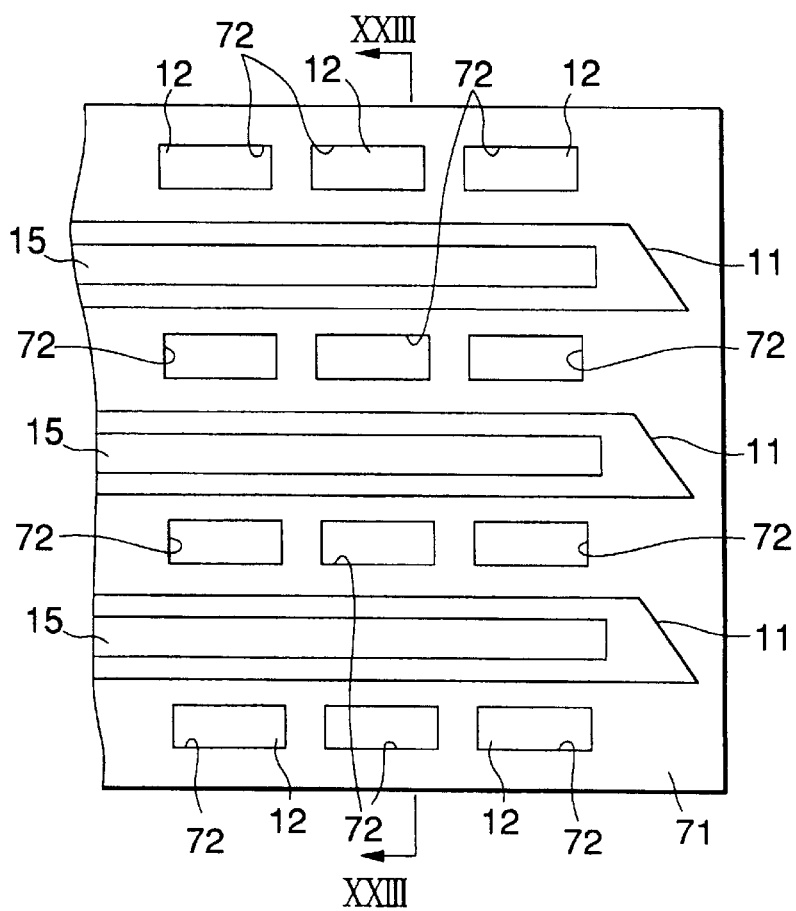
FIG. 22 is a plan view of an ink-jet recording head using an actuator with a piezo-electric element as an actuator according to Embodiment 11 of the present invention.
Figure 23:
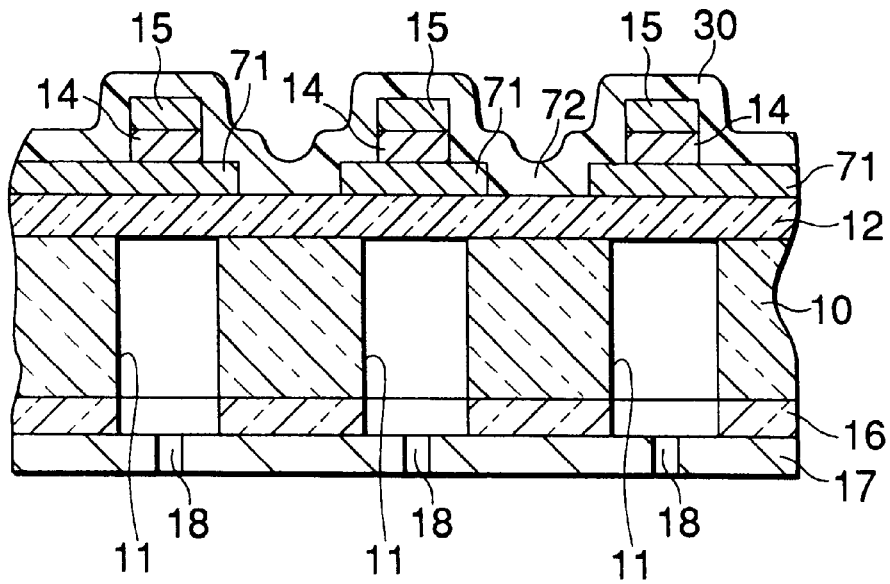
FIG. 23 is a sectional view taken on line XXIII—XXIII of FIG. 22.

FIG. 22 is a plan view of an ink-jet recording head with an actuator with piezo-electric element employed as an actuator according to Embodiment 11 of the present invention; and FIG. 23 is a sectional view taken along line XXIII—XXIII of FIG. 22.

As shown in FIGS. 22 to 23, the ink-jet recording head according to Embodiment 11 of the present invention comprises the silicon substrate 10 provided with the plurality of ink cavities 11, lower electrodes 71 formed through the silicon oxide film 12 on one side of the silicon substrate 10, the lower electrode having an opening 72 where the silicon oxide films 12 is exposed in a desired portion other than the region where the PZT film 14 and the upper electrode 15 are formed, the PZT films 14 formed on the respective lower electrodes 71, the upper electrodes 15 formed on the respective PZT films 14, and the nozzle plate 17 provided through the silicon oxide film 16 on the other side of the silicon substrate 10.

As a portion where the passivation film 30 or interlayer insulating film 50 contacts the silicon oxide film 12 is secured by the opening 72 in the ink-jet recording head thus structured like this, the adhesion of the passivation film 30 or interlayer insulating film 50 is made improvable and the resistance of the lower electrode 71 is also made reducible thereby.

The size of the opening 72 may be decided optionally to the extent that the function of the lower electrode of the piezo-electric element is not impaired. Further, the opening is applicable to the second lower electrode in any one of the above-described preceding embodiments of the present invention.

Embodiment 12

Referring to the drawings, Embodiment 12 of the present invention will be described, wherein like reference characters designate like members in the preceding embodiments thereof and the detailed description thereof will be omitted.

Figure 24:
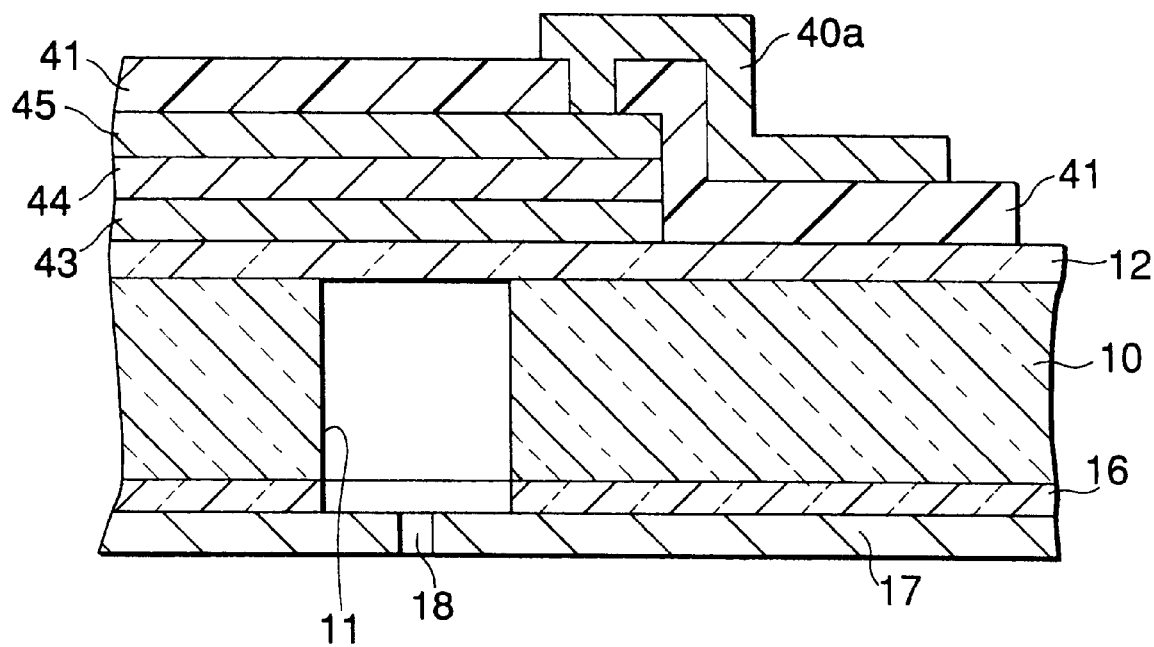
FIG. 24 is a sectional view of an ink-jet recording head using an actuator with a piezo-electric element as an actuator according to Embodiment 12 of the present invention.
Figure 25:
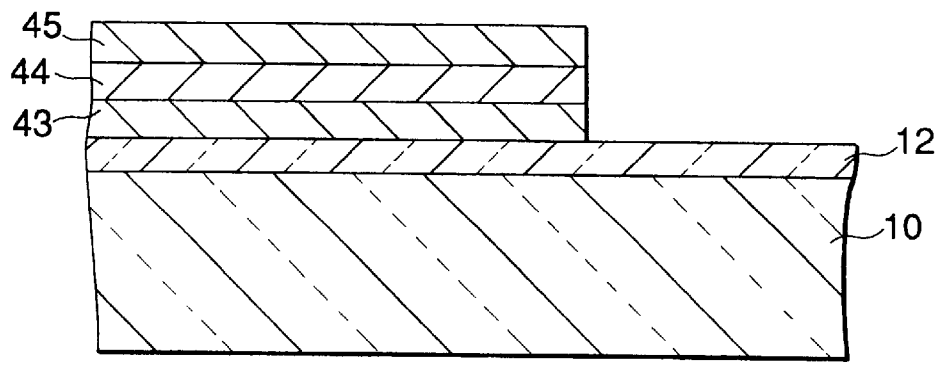
FIGS. 25(1) to 25(3) are sectional views showing a process for manufacturing an ink-jet recording head shown in FIG. 24.
Figure 25:
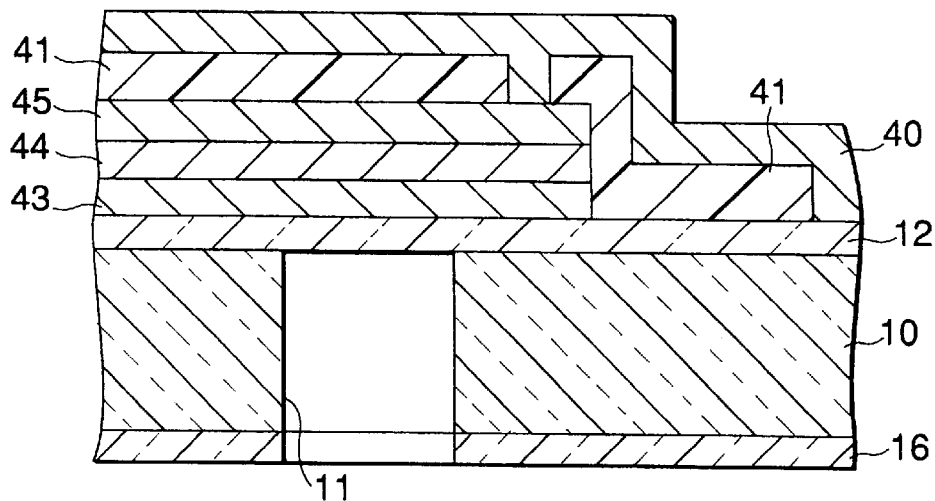
Figure 25:
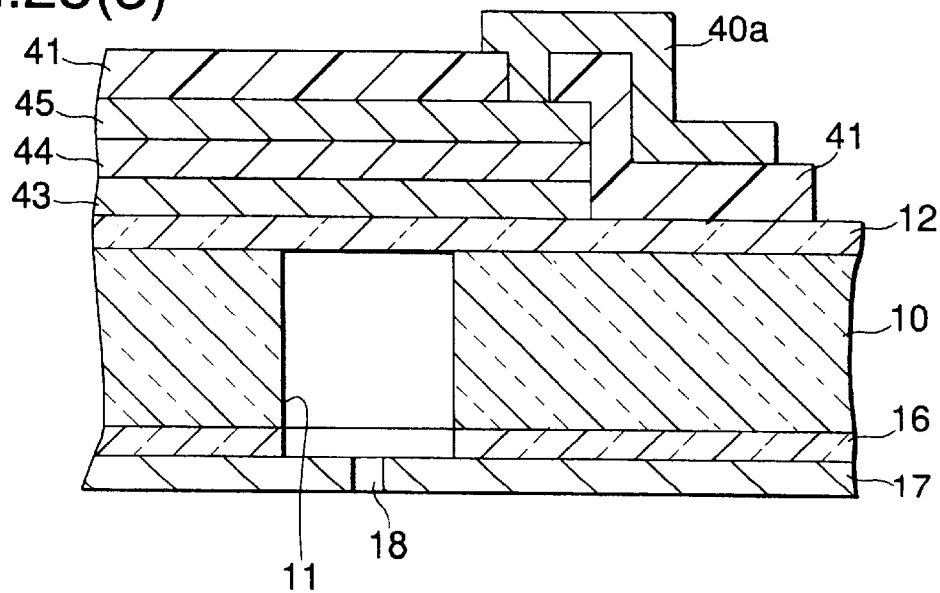

FIG. 24 is a partial sectional view of an ink-jet recording head with an actuator with piezo-electric element employed as an actuator according to Embodiment 12 of the present invention; and FIGS. 25(1) to 25(3) are sectional views showing the process steps of producing the ink-jet recording head shown in FIG. 24.

As shown in FIG. 24, the ink-jet recording head according to Embodiment 12 of the present invention comprises the silicon substrate 10 provided with the plurality of ink cavities 11, lower electrodes 43 formed through the silicon oxide film 12 on one side of the silicon substrate 10, PZT films 44 formed on the respective lower electrodes 43, upper electrodes 45 formed on the respective PZT films 44, wiring 40a connected to the upper electrodes 45, and the nozzle plate 17 provided through the silicon oxide film 16. Reference numeral 41 denotes an interlayer insulating film.

Next, a process far manufacturing the ink-jet recording head thus structured will be described with reference to FIGS. 25(1) to 25(3).

At the step shown in FIG. 25(1), the lower electrode 43, the PZT film 44 an the upper electrode 45 having a predetermined shape are formed on the silicon oxide film 12 formed on the silicon substrate 10.

At the following step shown in FIG. 25(2), the interlayer insulating film 41 is formed on the silicon substrate 10 on which the lower electrode 43, the PZT film 44 and the upper electrode 45 are formed. Further, a contact hole connected to the upper electrode 45 is formed on the interlayer insulating film 41, and a passivation film 40 of nickel is formed thereon. At this time, the contact hole is filled with the passivation film 40. The passivation film 40 functions as an etching protective film for use in forming the ink cavity 11 in the silicon substrate 10. The silicon oxide film 16 and then the silicon substrate 10 are selectively etched in order to form the ink cavity 11 in the silicon substrate 10.

At the following step shown in FIG. 25(3), the wiring 40a connected to the upper electrode 45 is formed by patterning the passivation film 40. In this case, the nickel film has conductive properties and is resistant to an etching solution. For this reason, the use of such a nickel film as the passivation film 40 for the ink-jet recording head according to Embodiment 2 of the present invention needless to say makes it possible to not only protect the elements during the etching process but also utilize the passivation film as a wiring material to be formed later. Thus, the manufacturing process is simplified and the material cost is also reducible.

Further, the nozzle plate 17 with the discharge port 18 formed through the silicon oxide film 16 on the side where the silicon oxide film 16 of the silicon substrate 10 is formed. Then the predetermined stops are followed to complete the inkjet recording head.

This passivation film 40 of nickel may be applied to the ink-jet recording head according to Embodiment 1 of the present invention.

Embodiment 13

Referring to the drawing, Embodiment 13 of the present invention will be described, wherein like reference characters designate like members in the preceding embodiments thereof and the detailed description thereof will be omitted.

Figure 26:
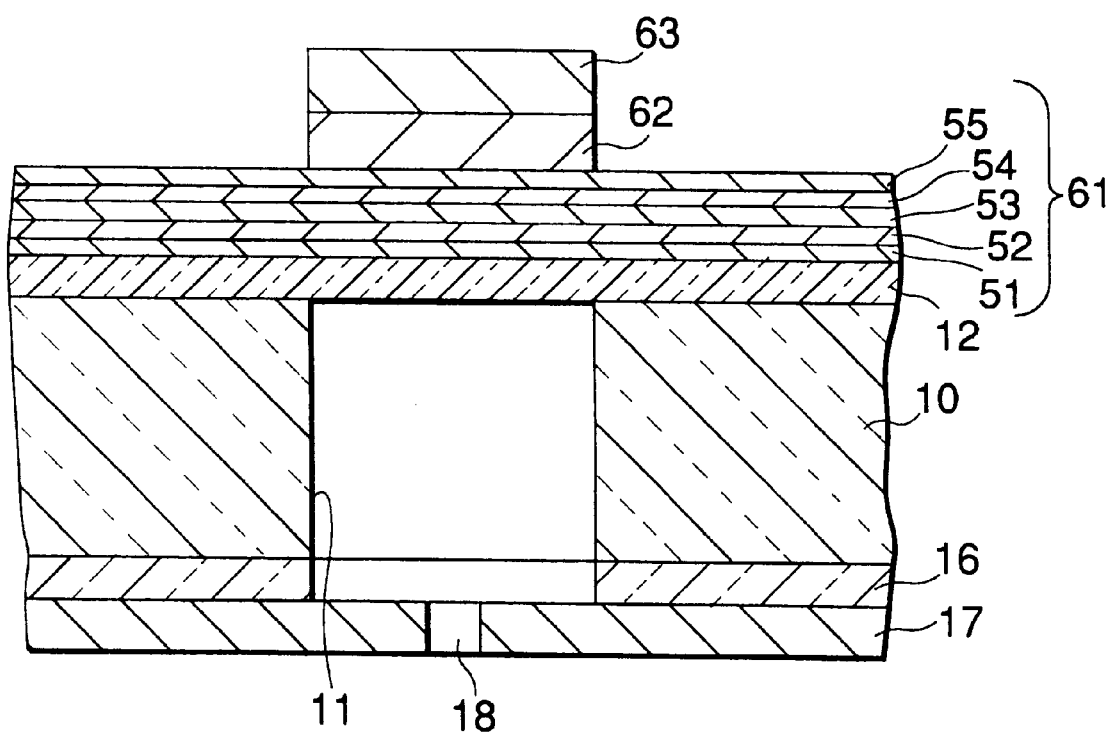
FIG. 26 is a partial sectional view of an ink-jet recording head according to Embodiment 13 of the present invention.

FIG. 26 is a partial sectional view of an ink-jet recording head according to Embodiment 13 of the present invention.

As shown in FIG. 26, the ink-jet recording head according to Embodiment 13 of the present invention comprises the silicon substrate 10 provided with the plurality of ink cavities 11, lower electrodes 61 formed through the silicon oxide film 12 on one side of the silicon substrate 10, PZT films 62 formed on the respective lower electrodes 61, upper electrodes 63 formed on the respective PZT films 62, and the nozzle plate 17 provided through the silicon oxide film 16.

The lower electrode 61 employs a five-layered structure comprising a nickel film 51, a titanium film 52, a titanium oxide film 53 and a titanium film 54 and a platinum film 55 which are arranged in order from the silicon oxide film 12 side. As described above, the nickel film 51 is resistant to the etching solution used when the silicon substrate 10 is selectively etched. Therefore, the nickel film 51 can be made to function as a protective film for the lower electrode 61 itself, the PZT film 62 and the upper electrode 63 when etching is conducted in order to form the ink cavity 11 even though the etching solution infiltrates through the silicon substrate 10. Consequently, the etching solution or an etching reactant is prevented at the end of etching from penetrating through the silicon oxide film 12, thus causing no damage to the lower electrode 61, the PZT file 62 and the upper electrode 63.

The advantage in addition to what has been mentioned above is that the reliability of the lower electrode 61 is improvable as a result of the fact that the adhesion of the titanium film 52, the titanium oxide film 53 and the titanium film 54 to the nickel film 51 and the platinum film 55 is improved.

Although the five-layered structure has been used for the lower electrode 61 according to Embodiment 13 of the present invention, the multilayer structure is not limited to what has been mentioned in this embodiment thereof but may be such that any other conductive material such as zirconia, iridium, titanium-zirconia alloy, iridium-titanium alloy and so on is used for the purpose on condition that the lowermost layer (layer close to the silicon substrate) is formed of the is nickel film.

Moreover, the lower electrode according to Embodiment 13 of the present invention is needless to say applicable to the preceding embodiments thereof as described above.

Although a description has been given of the case where the piezo-electric element according to the present invention is used as an actuator for an ink-jet recording head in Embodiments 1–13 thereof, the piezo-electric element according to the present invention may be utilized for an actuator in various kinds of equipment.

As set forth above, the lower electrodes in the piezo-electric element according to the present invention are formed independently of each other on a segment basis in order to secure a portion where the insulating film exposed in between the segments or the first lower electrode and the interlayer insulating film or the passivation film are brought into contact with each other. Therefore, the interlayer insulating film or the passivation film is made adhere to both sides of the element to ensure high covering power, even though the adhesion of the interlayer insulating film or the passivation film to the element region is insufficient, so that a chemically stable interlayer insulating film or a passivation film is formable. Consequently, a reliable piezo-electric element is obtainable because the ink cavity is formable without any damage caused to the element.

Further, a part of the diaphragm region is prevented from being covered with the lower electrode by forming the lower electrode or the second lower electrode in such a manner as to make its width narrower than that of the ink cavity, whereby in addition to the effect mentioned above, a strong vibration is obtainable.

In a case where the width of the lower electrode or the second lower electrode is set greater than that of the ink cavity, the hydrogen generated when the ink cavity is formed by etching is prevented from penetrating into the piezo-electric element, so that a highly reliable piezo-electric element is obtainable.

By making the lowermost layer (on the substrate side) of the lower electrode a multilayer comprising one of the nickel, titanium and titanium oxide layers, the lower electrode can be made to function as an etching protective film for the piezo-electric film and the upper electrode. Thus, excellent etching can be conducted without causing any impediment to the piezo-electric element. Consequently, it is possible to provide a reliable piezo-electric element and an ink-jet recording head using the same.

The provision of the lower electrode having the five-layered structure results in improving the adhesion of the aforementioned nickel film to the platinum film, whereby a reliable electrode becomes available.

Further, the use of the conductive film as an element protective film for protecting the element from etching to be conducted when the ink cavity is formed on the silicon substrate makes utilizable the element protective film as a film for use in forming wiring after the etching operation is terminated. Consequently, the manufacturing process is simplified and the production cost is also reducible.

What is claimed is:

1. An actuator with a piezo-electric element comprising:
   a substrate;
   an insulating film disposed on the substrate;
   lower electrodes disposed on the insulating film;
   piezo-electric films disposed on the respective lower electrodes;
   upper electrodes disposed on the respective piezo-electric films; and
   an interlayer insulating film, covering the lower electrodes, piezo-electric films and the upper electrodes which respectively comprise a segment,
   wherein the lower electrodes are disposed independently of each other for each segment, and
   wherein the insulating film disposed on the substrate and between each segment is brought into direct contact with the interlayer insulating film.

2. An actuator with a piezo-electric element comprising:
   a substrate;
   an insulating film disposed on the substrate;
   lower electrodes disposed on the insulating film;
   piezo-electric films disposed on the respective lower electrodes;
   upper electrodes disposed on the respective piezo-electric films; and
   a passivation film covering the lower electrodes, piezo-electric films and the upper electrodes which respectively comprise a segment,
   wherein the lower electrodes are disposed independently of each other for each segment, and
   the insulating film disposed on the substrate and between each segment is brought into direct contact with the passivation film.

3. An actuator with a piezo-electric element as claimed in claim 1 or claim 2, further comprising a cavity in the substrate at a position corresponding to each of the lower electrodes, a width of each of the lower electrodes being narrower than a width of the cavity.

4. An actuator with a piezo-electric element as claimed in claim 1 or claim 2, further comprising a cavity in the substrate at a position corresponding to each of the lower electrodes, a width of each of the lower electrodes being the same as or greater than a width of the cavity.

5. An actuator with a piezo-electric element as claimed in claim 3, wherein a wiring is disposed between adjacent ones of the lower electrodes.

6. An actuator with piezo-electric element comprising:
   a substrate;
   an insulating film disposed on the substrate;
   lower electrodes disposed on the insulating film;
   piezo-electric films disposed on the respective lower electrodes;
   upper electrodes disposed on the respective piezo-electric films; and
   an interlayer insulating film, covering the lower electrodes, piezo-electric films and the upper electrodes which respectively comprise a segment,
   wherein each of the lower electrodes has an opening through which the insulating film is exposed in a desired region other than a region where each of the piezo-electric films and each of the upper electrodes are disposed, the insulating film thus exposed being brought into direct contact with the interlayer insulating film.

7. An actuator with a piezo-electric element comprising:
   a substrate;
   an insulating film disposed on the substrate;
   lower electrodes disposed on the insulating film;
   piezo-electric films disposed on the respective lower electrodes;
   upper electrodes disposed on the respective piezo-electric films; and
   a passivation film, covering the lower electrodes, piezo-electric films and the upper electrodes which respectively comprise a segment,
   wherein each of the lower electrodes has an opening through which the insulating film is exposed in a desired region other than a region where each of the piezo-electric films and the upper electrodes are disposed, the insulating film thus exposed being brought into direct contact with the passivation film.

8. An actuator with a piezo-electric element as claimed in claim 1, 2, 6, or 7, wherein the lower electrodes are made of one of platinum and platinum alloy.

9. An actuator with a piezo-electric element comprising:
   a substrate;
   an insulating film disposed on the substrate;

first lower electrodes disposed on the insulating film;

second lower electrodes disposed on the respective first lower electrodes;

piezo-electric films disposed on the respective second lower electrodes;

upper electrodes disposed on the respective piezo-electric films; and an interlayer insulating film, covering the first and second lower electrodes, the piezo-electric films and the upper electrodes which respectively comprise a segment, wherein the first lower electrodes are made of conductive material other than one of platinum and platinum alloy, wherein the second lower electrodes are disposed independently of each other for each segment, and wherein each of the first lower electrodes disposed between each segment is brought into direct contact with the interlayer insulating film.

10. An actuator with a piezo-electric element comprising:

a substrate;

an insulating film disposed on the substrate;

first lower electrodes disposed on the insulating film;

second lower electrodes disposed on the respective first lower electrodes;

piezo-electric films disposed on the respective second lower electrodes;

upper electrodes disposed on the respective piezo-electric films; and a passivation film, covering the first and second lower electrodes, the piezo-electric films and the upper electrodes which respectively comprise a segment, wherein the first lower electrodes are made of conductive material other than one of platinum and platinum alloy, wherein the second lower electrodes are disposed independently of each other for each segment, and wherein each of the first lower electrodes disposed between each segment is brought into direct contact with the passivation film.

11. An actuator with a piezo-electric element as claimed in claim 9 or 10, further comprising a cavity in the substrate at a position corresponding to each of the second lower electrodes, a width of each of the second lower electrodes being narrower than a width of the cavity.

12. An ink-jet recording head comprising an actuator with a piezo-electric element as recited in claim 1, 2, 6, 7, 9 or 10.

13. An actuator with a piezo-electric element as claimed in claim 9 or 10, further comprising a cavity in the substrate at a position corresponding to each of the second lower electrodes, a width of each of the second lower electrodes being the same as or greater than a width of the cavity.

14. An actuator with a piezo-electric element as claimed in claim 9 or 10, wherein the second lower electrodes are made of one of platinum and platinum alloy.

15. An actuator with a piezo-electric element as claimed in claim 9 or 10, wherein at least a lowermost layer of each of the first lower electrodes is formed of a nickel film.

16. An actuator with a piezo-electric element as claimed in claim 9 or 10, wherein at least a lowermost layer of each of the first lower electrodes is formed of a titanium film.

17. An actuator with a piezo-electric element as claimed in claim 9 or 10, wherein at least a lowermost layer of each of the first lower electrodes is formed of a titanium oxide film.

18. An actuator with a piezo-electric element as claimed in claim 9 or 10, wherein each of the first lower electrodes has a four-layered structure comprising a nickel film, a titanium film, a titanium oxide film and a titanium film which are arranged in order from a substrate side.

* * * * *